(12) United States Patent
Jung et al.

(10) Patent No.: US 10,615,340 B2
(45) Date of Patent: Apr. 7, 2020

(54) RESISTANCE RANDOM ACCESS MEMORY DEVICE AND PREPARING METHOD THEREOF

(71) Applicants: Research & Business Foundation Sungkyunkwan University, Suwon-si (KR); GLOBAL FRONTIER CENTER FOR MULTISCALE ENERGY SYSTEMS, Seoul (KR)

(72) Inventors: Hyun Suk Jung, Seoul (KR); Sang Myeong Lee, Suwon-si (KR); Byeong Jo Kim, Suwon-si (KR); Dong Geon Lee, Suwon-si (KR); Ji Hyun Baek, Suwon-si (KR); Jae Myeong Lee, Suwon-si (KR); Min Hee Kim, Suwon-si (KR); Won Bin Kim, Suwon-si (KR); So Yeon Park, Cheongju-si (KR); Miyeon Baek, Seoul (KR)

(73) Assignees: Research & Business Foundation Sungkyunkwan University, Suwon-si (KR); GLOBAL FRONTIER CENTER FOR MULTISCALE ENERGY SYSTEMS, Seoul (KR)

( * ) Notice: Subject to any disclaimer, the term of this patent is extended or adjusted under 35 U.S.C. 154(b) by 0 days.

(21) Appl. No.: 16/240,861

(22) Filed: Jan. 7, 2019

(65) Prior Publication Data
US 2019/0229266 A1 Jul. 25, 2019

(30) Foreign Application Priority Data

Jan. 23, 2018 (KR) ........................ 10-2018-0008156

(51) Int. Cl.
*H01L 45/00* (2006.01)

(52) U.S. Cl.
CPC ............ *H01L 45/147* (2013.01); *H01L 45/08* (2013.01); *H01L 45/1233* (2013.01); *H01L 45/14* (2013.01); *H01L 45/1608* (2013.01)

(58) Field of Classification Search
CPC ....... H01L 45/04; H01L 45/08; H01L 45/085; H01L 45/1233; H01L 45/14; H01L 45/147; H01L 45/1608
See application file for complete search history.

(56) References Cited

U.S. PATENT DOCUMENTS

| 9,896,462 B1* | 2/2018 | Ma ......................... C09K 11/06 |
| 2019/0189919 A1* | 6/2019 | Jung ................... H01L 45/1608 |

FOREIGN PATENT DOCUMENTS

| KR | 10-2011-0024479 A | 3/2011 |
| KR | 10-2016-0085720 A | 7/2016 |
| KR | 10-2017-0049758 A | 5/2017 |
| KR | 10-2017-0113453 A | 10/2017 |

* cited by examiner

*Primary Examiner* — Joseph C. Nicely
(74) *Attorney, Agent, or Firm* — NSIP Law

(57) ABSTRACT

The present disclosure relates to a resistive random access memory device and a preparing method of the resistive random access memory device, including: a first resistance change layer formed on a first electrode and comprising an organic metal halide having a three-dimensional perovskite crystal structure; a second resistance change layer formed on the first resistance change layer and comprising an organic metal halide having a two-dimensional perovskite crystal structure; and a second electrode formed on the second resistance change layer.

17 Claims, 22 Drawing Sheets

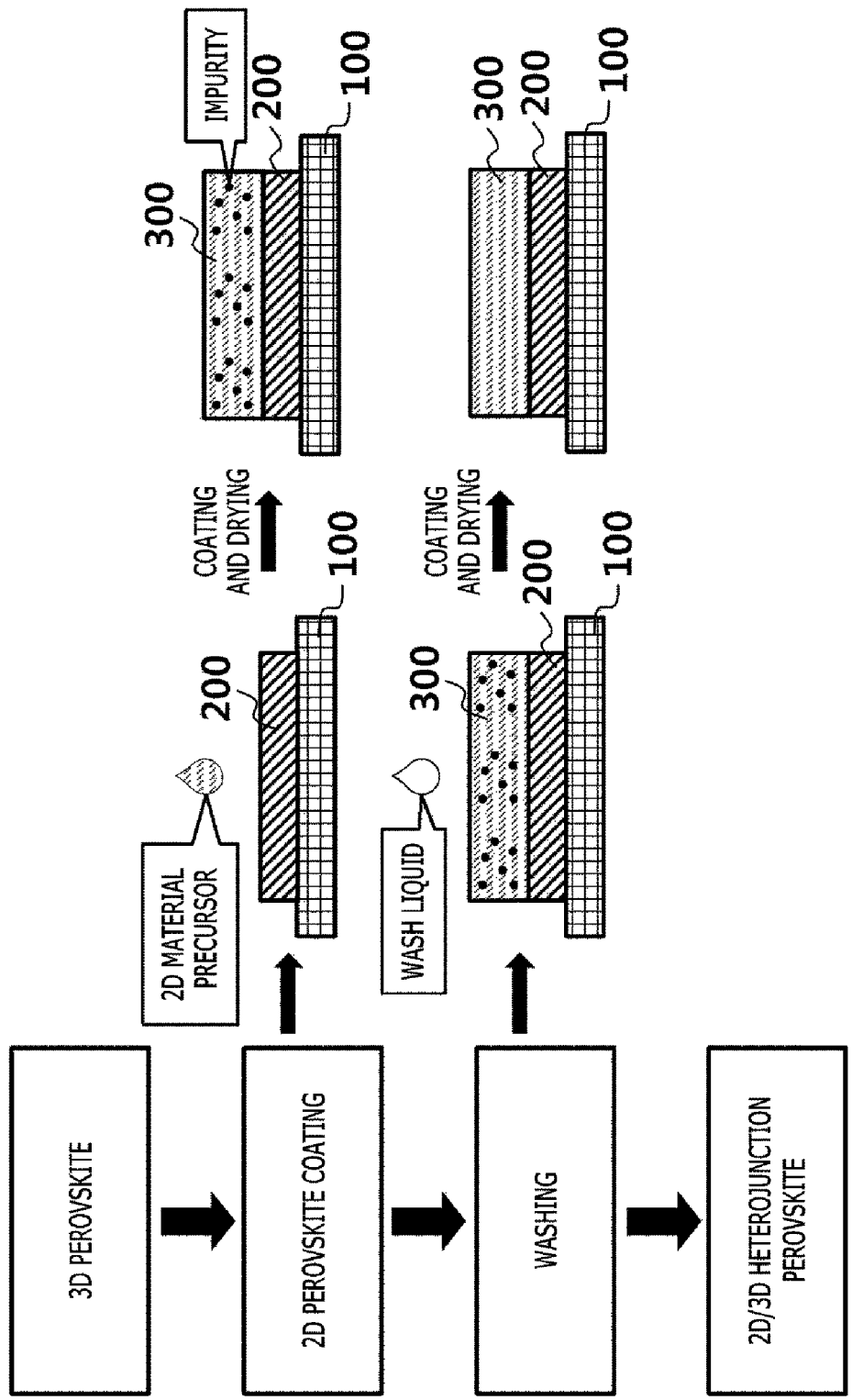

RESISTANCE RANDOM ACCESS MEMORY DEVICE AND PREPARING METHOD THEREOF

CROSS-REFERENCE TO RELATED APPLICATION

This application claims the benefit under 35 USC 119(a) of Korean Patent Application No. 10-2018-0008156 filed on Jan. 23, 2018, in the Korean Intellectual Property Office, the entire disclosure of which is incorporated herein by reference for all purposes.

TECHNICAL FIELD

The present disclosure relates to a resistive random access memory device including a resistance change layer having a heterojunction structure of a three-dimensional perovskite crystal structure and a two-dimensional perovskite crystal structure and a preparing method thereof.

BACKGROUND

A non-volatile memory has the advantage of ROM in that information stored therein is not erased even when power is not supplied and the advantage of RAM in that information can be easily input and output. Thus, the non-volatile memory is suitable for a mobile device such as a mobile phone, or the like. Examples of the non-volatile memory may include a resistive random access memory (RRAM), a magnetic random access memory (MRAM), a ferroelectric random access memory (FRAM), a phase-change random access memory (PRAM), and the like. Particularly, the resistive random access memory is one of the next-generation non-volatile memory devices with considerable competitiveness as compared with flash memory due to its features of low power, ultra-high speed, non-volatility, and simple structure.

A resistive random access memory device which has received a lot of attention as a next-generation memory device due to its high-density and low-power characteristics may increase or decrease an electric resistance using an electric signal to record information depending on a resistance state. The resistive random access memory device employs a simple device structure (metal/oxide/metal) and is configured to switch from a high resistance state unsuitable for conduction to a low resistance state suitable for conduction when an appropriate voltage/current is applied. These two resistance states are distinguished by a difference between "0" and "1" and the resistive random access memory device refers to a memory device that recognizes the resistance states. Resistive random access memory devices are classified in more detail into a phase-change access memory (PRAM) using phase change, a magnetic RAM (MRAM) using spin change, and a Resistive RAM (RRAM) using the movement of ions in a material, depending on a method of switching a resistance in a material.

The resistive random access memory device has a structure in which an upper electrode and a lower electrode are placed on a thin film and a resistance change layer formed of an oxide thin film is interposed between the upper and the lower electrodes. The memory operates by changing the resistance of the resistance change layer depending on a voltage applied to the resistance change layer.

The resistance of the resistive random access memory device is changed as a metal filament is formed and eliminated by redox reactions of metal atoms or metal ions permeating from a metal electrode into the resistance change layer depending on a voltage applied to the resistance change layer. As materials of the resistance change layer, solid electrolyte materials such as oxides or GeS have been used mainly. However, an oxide-based solid electrolyte material shows a very unstable distribution of HRS/LRS resistances and SET/RESET voltages and it is very difficult to manipulate them. Accordingly, the development of new materials of the resistance change layer is needed to solve this problem.

Korean Patent Laid-open Publication No. 2017-0049758 discloses a resistance change memory device including an organic-inorganic hybrid perovskite as a resistance change layer and a method for fabricating the same. However, $RNH_3MX^1{}_nX^2{}_{(3-n)}$ perovskite (R may be a $C_1$-$C_3$ alkyl group, a $C_5$-$C_7$ cycloalkyl group, or a $C_6$-$C_{20}$ aryl group, M may be a divalent metal ion, $X^1$ and $X^2$ may be halogen ions different from each other, and n is a real number of from 0 to 3) which has been used for a resistance change layer in a perovskite-based resistive random access memory device has low voltage and high efficiency, but a perovskite thin film itself shows low moisture and light stability and low durability. Therefore, a resistance change layer having a new structure capable of improving the stability and durability is needed.

SUMMARY

In view of the foregoing, the present disclosure provides a resistive random access memory device which can implement higher stability to moisture and light and higher durability by forming a resistance change layer having a new perovskite structure on a resistance change layer having a conventional perovskite structure than conventional resistive random access memory devices and a preparing method thereof.

However, problems to be solved by the present disclosure are not limited to the above-described problems. There may be other problems to be solved by the present disclosure.

According to a first aspect of the present disclosure, there is provided a resistive random access memory device, including: a first resistance change layer formed on a first electrode and comprising an organic metal halide having a three-dimensional perovskite crystal structure; a second resistance change layer formed on the first resistance change layer and comprising an organic metal halide having a two-dimensional perovskite crystal structure; and a second electrode formed on the second resistance change layer.

According to an embodiment of the present disclosure, the resistive random access memory device may further include a polymer protective layer formed on the second resistance change layer, but may not be limited thereto.

According to an embodiment of the present disclosure, the second resistance change layer may include perovskite particles having a bulk structure, but may not be limited thereto.

According to an embodiment of the present disclosure, a filament size of the first resistance change layer may be controlled by the second resistance change layer to improve durability of the resistive random access memory device.

According to an embodiment of the present disclosure, a heterojunction structure of the three-dimensional perovskite crystal structure and the two-dimensional perovskite crystal structure may provide stability to moisture and light.

According to an embodiment of the present disclosure, the organic metal halide having the three-dimensional perovskite crystal structure may be represented by the following Chemical Formula 1, but may not be limited thereto:

RMX₃ [Chemical Formula 1]

(R is a substituted or unsubstituted $C_1$-$C_{24}$ alkyl group, and when R is substituted, its substituent is an amino group, a hydroxyl group, a cyano group, a halogen group, a nitro group, or a methoxy group,
M includes a metal cation selected from the group consisting of Pb, Sn, Ge, Cu, Ni, Co, Fe, Mn, Cr, Pd, Cd, Yb, and combinations thereof, and
X includes a halide anion or a chalcogenide anion).

According to an embodiment of the present disclosure, the organic metal halide having the two-dimensional perovskite crystal structure may be represented by the following Chemical Formula 2, but may not be limited thereto:

R₂MX₄ [Chemical Formula 2]

(R is a substituted or unsubstituted $C_1$-$C_{24}$ alkyl group, and when R is substituted, its substituent is an amino group, a hydroxyl group, a cyano group, a halogen group, a nitro group, or a methoxy group,
M includes a metal cation selected from the group consisting of Pb, Sn, Ge, Cu, Ni, Co, Fe, Mn, Cr, Pd, Cd, Yb, and combinations thereof, and
X includes a halide anion or a chalcogenide anion).

According to an embodiment of the present disclosure, the polymer protective layer may include an ionic conductive polymer selected from the group consisting of polymethyl methacrylate, polyethylene oxide, polypropylene oxide, polydimethylsiloxane, polyacrylonitrile, polyvinyl chloride, polyvinylidene fluoride, polyvinylidene fluoride-hexafluoropropylene, polyethyleneimine, polyphenylene terephthalamide, poly(methoxy polyethylene glycol methacrylate), poly(2-methoxy ethyl glycidyl ether), and combinations thereof, but may not be limited thereto.

According to an embodiment of the present disclosure, the first electrode and the second electrode may each independently include a material selected from the group consisting of a metal, a conductive polymer, a carbonaceous material, and combinations thereof, but may not be limited thereto.

According to a second aspect of the present disclosure, there is provided a preparing method of a resistive random access memory device, including: forming a first electrode on a substrate; forming a first resistance change layer, on the first electrode, comprising an organic metal halide having a three-dimensional perovskite crystal structure; forming a second resistance change layer, on the first resistance change layer, comprising an organic metal halide having a two-dimensional perovskite crystal structure; and forming a second electrode on the second resistance change layer.

According to an embodiment of the present disclosure, the forming of the first resistance change layer may be performed by coating, on the first electrode, a solution in which the organic metal halide having the three-dimensional perovskite crystal structure is dissolved in a first solvent, but may not be limited thereto.

According to an embodiment of the present disclosure, the first solvent may be selected from the group consisting of dimethylformamide, dimethylsulfoxide, dimethylacetamide, N-methylpyrrolidone, N-methyl-2-pyridine, pyridine, aniline, and combinations thereof, but may not be limited thereto.

According to an embodiment of the present disclosure, the second resistance change layer may be formed to have the two-dimensional perovskite crystal structure by coating, on the first resistance change layer, a solution in which an organic halide is dissolved in a second solvent and partially melting some of the three-dimensional perovskite crystals with the second solvent, but may not be limited thereto.

According to an embodiment of the present disclosure, the second solvent may be a protic solvent including branched alcohols having 3 to 6 carbon atoms, but may not be limited thereto.

According to an embodiment of the present disclosure, the preparing method may further include forming a polymer protective layer on the second resistance change layer, but may not be limited thereto.

According to an embodiment of the present disclosure, the organic metal halide having the three-dimensional perovskite crystal structure may be represented by the following Chemical Formula 3, but may not be limited thereto:

RMX₃ [Chemical Formula 3]

(R is a substituted or unsubstituted $C_1$-$C_{24}$ alkyl group, and when R is substituted, its substituent is an amino group, a hydroxyl group, a cyano group, a halogen group, a nitro group, or a methoxy group,
M includes a metal cation selected from the group consisting of Pb, Sn, Ge, Cu, Ni, Co, Fe, Mn, Cr, Pd, Cd, Yb, and combinations thereof, and
X includes a halide anion or a chalcogenide anion).

According to an embodiment of the present disclosure, the organic metal halide having the two-dimensional perovskite crystal structure may be represented by the following Chemical Formula 4, but may not be limited thereto:

R₂MX₄ [Chemical Formula 4]

(R is a substituted or unsubstituted $C_{1-24}$ alkyl group, and when R is substituted, its substituent is an amino group, a hydroxyl group, a cyano group, a halogen group, a nitro group, or a methoxy group,
M includes a metal cation selected from the group consisting of Pb, Sn, Ge, Cu, Ni, Co, Fe, Mn, Cr, Pd, Cd, Yb, and combinations thereof, and
X includes a halide anion or a chalcogenide anion).

According to the above-described aspects of the present disclosure, a resistive random access memory device of the present disclosure can improve stability to moisture and light by joining a resistance change layer having a perovskite structure with good stability to moisture and light on a resistance change layer having a conventional perovskite structure.

Further, the resistive random access memory device of the present disclosure can implement higher stability than conventional resistive random access memory devices by controlling the size of a filament of a first resistance change layer with a second resistance change layer.

A preparing method of a resistive random access memory device of the present disclosure further includes only one process in addition to a conventional preparing method of a resistive random access memory device using a monolayer resistance change layer and thus is simple to perform.

The effects of the present disclosure are not limited to the aforementioned effects, and other effects, which are not mentioned above, will be apparent to those skilled in the art from the following description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 4 is a schematic diagram showing a process of forming a second resistance change layer on a first resistance change layer in a preparing method of a resistive random access memory device according to an embodiment of the present disclosure.

DETAILED DESCRIPTION

Figure 1:
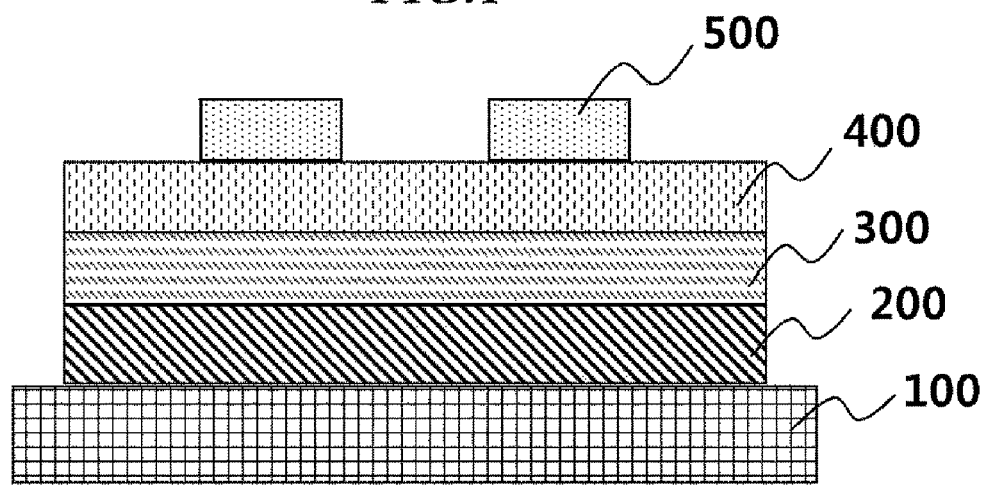
FIG. 1 is a cross-sectional view of a resistive random access memory device prepared according to an embodiment of the present disclosure.

Hereafter, examples will be described in detail with reference to the accompanying drawings so that the present disclosure may be readily implemented by those skilled in the art. However, it is to be noted that the present disclosure is not limited to the examples but can be embodied in various other ways. In the drawings, parts irrelevant to the description are omitted for the simplicity of explanation, and like reference numerals denote like parts through the whole document.

Throughout this document, the term "connected to" may be used to designate a connection or coupling of one element to another element and includes both an element being "directly connected" another element and an element being "electronically connected" to another element via another element.

Through the whole document, the terms "on", "above", "on an upper end", "below", "under", and "on a lower end" that are used to designate a position of one element with respect to another element include both a case that the one element is adjacent to the other element and a case that any other element exists between these two elements.

Through the whole document, the term "comprises or includes" and/or "comprising or including" used in the document means that one or more other components, steps, operation and/or existence or addition of elements are not excluded in addition to the described components, steps, operation and/or elements unless context dictates otherwise.

Through the whole document, the term "about or approximately" or "substantially" is intended to have meanings close to numerical values or ranges specified with an allowable error and intended to prevent accurate or absolute numerical values disclosed for understanding of the present disclosure from being illegally or unfairly used by any unconscionable third party. Through the whole document, the term "step of" does not mean "step for".

Through the whole document, the term "combination of" included in Markush type description means mixture or combination of one or more components, steps, operations and/or elements selected from a group consisting of components, steps, operation and/or elements described in Markush type and thereby means that the disclosure includes one or more components, steps, operations and/or elements selected from the Markush group.

Through the whole document, a phrase in the form "A and/or B" means "A or B, or A and B".

Through the whole document, the term "alkyl group" typically refers to a linear or branched alkyl group having 1 to 24 carbon atoms, 1 to 20 carbon atoms, 1 to 10 carbon atoms, 1 to 8 carbon atoms, 1 to 5 carbon atoms, or 1 to 3 carbon atoms. If the alkyl group is substituted with an alkyl group, this may also be interchangeably used as "branched alkyl group". A substituent which can substitute for the alkyl group may include at least one selected from the group consisting of halo (for example, F, Cl, Br, I), haloalkyl (for example, $CCl_3$ or $CF_3$), alkoxy, alkylthio, hydroxy, carboxy (—C(O)—OH), alkyloxy carbonyl (—C(O)—O—R), alkyl carbonyloxy (—O—C(O)—R), amino (—$NH_2$), carbamoyl (—C(O)—NHR), urea (—NH—C(O)—NHR—), and thiol (—SH), but may not be limited thereto. Further, an alkyl group having two or more carbon atoms among the above-described alkyl groups may include at least one carbon-carbon double bond or at least one carbon-carbon triple bond, but may not be limited thereto. For example, the alkyl group may include methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, acosanyl, or all the possible isomers thereof, but may not be limited thereto. For example, the alkyl group used herein may be an alkyl group having 1 to 10 carbon atoms, i.e., a methyl group, an ethyl group, a propyl group, a butyl group, a pentyl group, a hexyl group, a heptyl group, an octyl group, a nonyl group, or a decyl group, or an alkyl group having 1 to 6 carbon atoms, i.e., a methyl group, an ethyl group, a propyl group, a butyl group, a pentyl group, or a hexyl group, or an alkyl group having 1 to 4 carbon atoms, i.e., a methyl group, an ethyl group, an i-propyl group, a n-propyl group, a t-butyl group, a s-butyl group, or a n-butyl group, but may not be limited thereto.

Through the whole document, the term "halogen" or "halo" refers to a halogen element from Group 17 of the periodic table included as a functional group in a compound and may include, for example, chlorine, bromine, fluorine or iodine, but may not be limited thereto.

Hereafter, a resistive random access memory device and a preparing method thereof according to the present disclosure will be described in detail with reference to embodiments, examples and the accompanying drawings. However, the present disclosure may not be limited to the embodiments, examples, and drawings.

A first aspect of the present disclosure relates to a resistive random access memory device, including: a first resistance change layer formed on a first electrode and comprising an organic metal halide having a three-dimensional perovskite crystal structure; a second resistance change layer formed on the first resistance change layer and comprising an organic metal halide having a two-dimensional perovskite crystal structure; and a second electrode formed on the second resistance change layer.

According to an embodiment of the present disclosure, the resistive random access memory device may further include a polymer protective layer formed on the second resistance change layer, but may not be limited thereto.

FIG. 1 is a cross-sectional view of a resistive random access memory device prepared according to an embodiment of the present disclosure.

To be specific, the resistive random access memory device according to an embodiment of the present disclosure may include a first electrode 100, a first resistance change layer 200 formed on the first electrode 100 and comprising an organic metal halide having a three-dimensional perovskite crystal structure, a second resistance change layer 300 formed on the first resistance change layer 200 and comprising an organic metal halide having a two-dimensional perovskite crystal structure, a polymer protective layer 400 formed on the second resistance change layer 300, and a second electrode 500 formed on the polymer protective layer 400, but may not be limited thereto.

The first electrode 100 may be formed on a substrate, but may not be limited thereto.

In an embodiment of the present disclosure, the first electrode 100 may include a material selected from the group consisting of a metal, a conductive polymer, a carbonaceous material, and combinations thereof, but may not be limited thereto.

The metal may include a metal selected from the group consisting of Pt, Ti, Cu, Ni, Sc, V, Cr, Mn, Fe, Co, Zn, Y, Zr, Nb, Mo, Tc, Ru, Rh, Pd, Ag, Cd, Hf, Ta, W, Re, Os, Ir, Au, Hg, Rf, Db, Sg, Bh, Hs, Mt, Ds, Rg, Cn, and combinations thereof, but may not be limited thereto.

The conductive polymer may include a material selected from the group consisting of poly(3,4-ethylenedioxythiophene), poly(3,4-ethylenedioxythiophene) polystyrene sulfonate, polyacetylene, polypyrrole, polythiophene, polyaniline, polyphenylene, polyphenylene sulfide, polyfullerene, and combinations thereof, but may not be limited thereto.

The carbonaceous material may include a carbonaceous material selected from the group consisting of carbon nanotube, graphene, fullerene, carbon nanofiber, and combinations thereof, but may not be limited thereto.

According to an embodiment of the present disclosure, the second resistance change layer 300 may include perovskite particles having a bulk structure, but may not be limited thereto.

If the perovskite particles having a bulk structure are used to two-dimensionally crystallize perovskite, the perovskite may have a crystal phase stable to moisture.

In an embodiment of the present disclosure, the size of a filament 210 of the first resistance change layer 200 may be controlled by the second resistance change layer 300 to improve the durability of the resistive random access memory device.

Figure 2A:
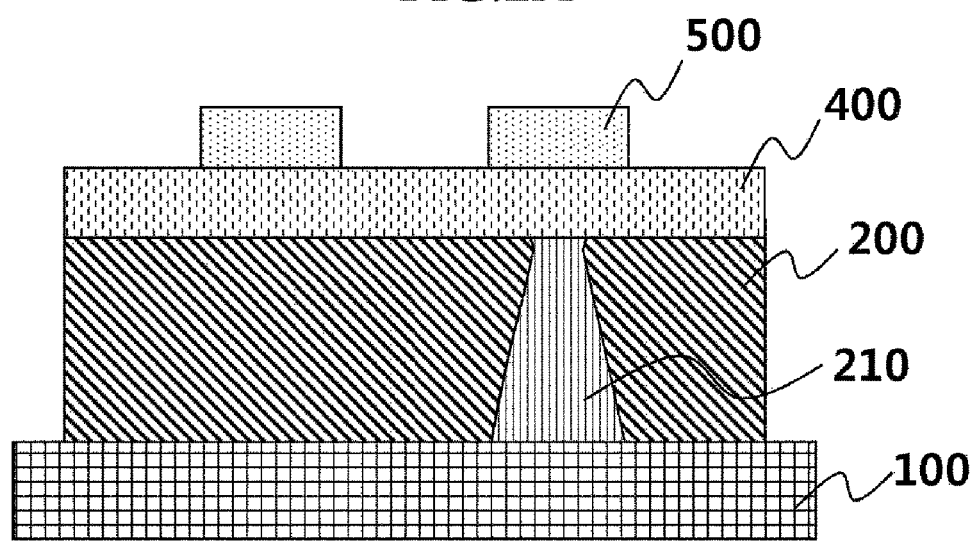
FIG. 2A and FIG. 2B show cross-sectional views of a resistive random access memory device in which a filament is formed in a resistance change layer prepared according to each of a comparative example and an embodiment of the present disclosure.
Figure 2B:
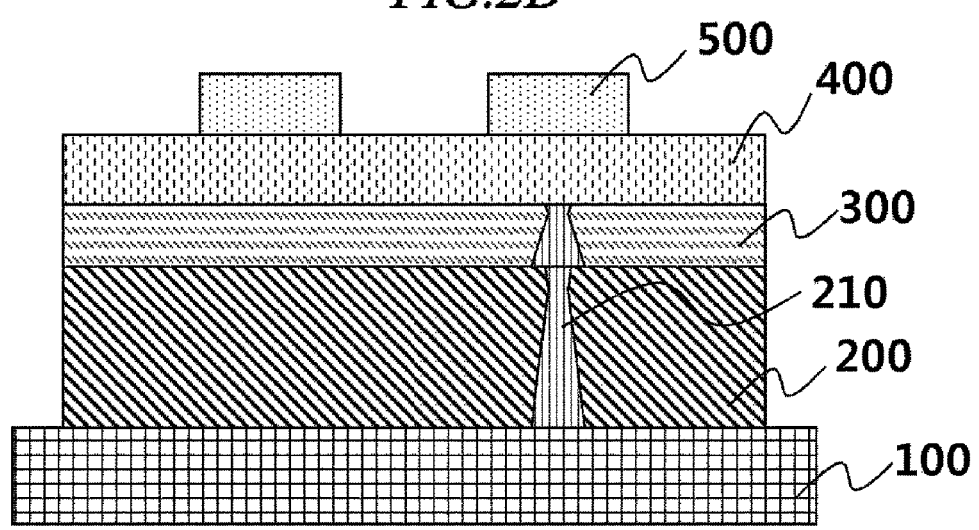

FIG. 2A and FIG. 2B show cross-sectional views of a resistive random access memory device in which the filament 210 is formed in a resistance change layer prepared according to each of a comparative example and an embodiment of the present disclosure. Referring to FIG. 2A, the resistive random access memory device according to a comparative example has a structure containing one kind of perovskite and the filament 210 grows greatly, which results in a decrease in durability. Meanwhile, referring to FIG. 2B, the resistive random access memory device according to an example of the present example has a heterojunction structure of a three-dimensional perovskite crystal structure and a two-dimensional and an upper perovskite layer suppresses the growth of the filament 210, and, thus, the filament 210 has a small size. Therefore, the resistive random access memory device according to an example of the present example has excellent durability as compared with the resistive random access memory device according to a comparative example.

In an embodiment of the present disclosure, a heterojunction structure of the three-dimensional perovskite crystal structure and the two-dimensional perovskite crystal structure may provide the stability to moisture and light.

The stability to moisture and light of the resistive random access memory device may be improved by forming a heterojunction of the second resistance change layer 300 comprising the organic metal halide having a two-dimensional perovskite crystal structure with high stability to moisture and light on the first resistance change layer 200 comprising the organic metal halide having a three-dimensional perovskite crystal structure.

According to an embodiment of the present disclosure, the organic metal halide having the three-dimensional perovskite crystal structure may be represented by the following Chemical Formula 1, but may not be limited thereto:

$$RMX_3 \quad \text{[Chemical Formula 1]}$$

(R is a substituted or unsubstituted $C_{1-24}$ alkyl group, and when R is substituted, its substituent is an amino group, a hydroxyl group, a cyano group, a halogen group, a nitro group, or a methoxy group, M includes a metal cation selected from the group consisting of Pb, Sn, Ge, Cu, Ni, Co, Fe, Mn, Cr, Pd, Cd, Yb, and combinations thereof, and X includes a halide anion or a chalcogenide anion).

In an embodiment of the present disclosure, in Chemical Formula 1, R is a monovalent organic ammonium ion represented by $(R^1R^2R^3R^4N)^+$ and $R^1$ to $R^4$ may each independently include a member selected from the group consisting of a linear or branched alkyl group having 1 to 24 carbon atoms, a cycloalkyl group having 3 to 20 carbon atoms, an aryl group having 6 to 20 carbon atoms, and combinations thereof, but may not be limited thereto.

In an embodiment of the present disclosure, in Chemical Formula 1, R is a monovalent organic ammonium ion represented by $(R^5—NH_3)+$, and $R^5$ may include a member selected from the group consisting of a linear or branched alkyl group having 1 to 24 carbon atoms, a cycloalkyl group having 3 to 20 carbon atoms, an aryl group having 6 to 20 carbon atoms, and combinations thereof, but may not be limited thereto.

In an embodiment of the present disclosure, in Chemical Formula 1, R may be represented by Chemical Formula $(R^6R^7N=CH—NR^8R^9)^+$, and $R^6$ may be hydrogen, an unsubstituted or substituted alkyl group having 1 to 20 carbon atoms, or an unsubstituted or substituted aryl group; $R^7$ may be hydrogen, an unsubstituted or substituted alkyl group having 1 to 20 carbon atoms, or an unsubstituted or substituted aryl group; $R^8$ may be hydrogen, an unsubstituted or substituted alkyl group having 1 to 20 carbon atoms, or an unsubstituted or substituted aryl group; and $R^9$ may be hydrogen, an unsubstituted or substituted alkyl group having 1 to 20 carbon atoms, or an unsubstituted or substituted aryl group, but may not be limited thereto.

The alky group used herein may be a substituted or unsubstituted, linear or branched chain saturated radical, and it is often a substituted or an unsubstituted linear chain saturated radical and may be, for example, an unsubstituted linear chain saturated radical, but may not be limited thereto. For example, the alkyl group having 1 to 20 carbon atoms used herein may be a substituted or unsubstituted, linear or branched chain saturated hydrocarbon radical, but may not be limited thereto.

When the alkyl group is substituted, its substituent may include one or more substituents selected from the following examples, but may not be limited thereto. The substituent may include an substituted or unsubstituted alkyl group having 1 to 20 carbon atoms, a substituted or unsubstituted aryl group, a cyano group, an amino group, an alkyl amino group having 1 to 10 carbon atoms, a dialkyl amino group having 1 to 10 carbon atoms, an aryl amino group, a diaryl amino group, arylalkyl amino group, an amino group, an amide group, a hydroxy group, an oxo group, a halo group, a carboxy group, an ester group, an acyl group, an acyloxy group, an alkoxy group having 1 to 20 carbon atoms, an aryloxy group, a haloalkyl group, a sulfonic acid group, a sulfone group (i.e., thiol,—SH), an alkylthio group having 1 to 10 carbon atoms, an arylthio group, a sulfonyl group, a phosphate group, a phosphate ester group, a phosphonic acid group, and a phosphonate ester group, but may not be limited thereto. For example, the substituted alkyl group may include a halogen alkyl group, a hydroxy alkyl group, an alkoxy alkyl group, or an alkaryl group, but may not be limited thereto. The alkaryl group pertains to a substituted alkyl group having 1 to 20 carbon atoms and refers to an alkyl group in which at least one hydrogen atom has been substituted with an aryl group. For example, the aryl group that substitutes for the at least one hydrogen atom may include a benzyl group (phenylmethyl, $PhCH_2$—), a benzhydryl group ($Ph_2CH$—), a trityl group (triphenylmethyl, $Ph_3C$—), phenethyl (Ph-$CH_2CH_2$—), a styryl group (PhCH=CH—), or a cinnamyl group (PhCH=CHCH$_2$—), but may not be limited thereto.

For example, $R^1$ to $R^{10}$ may be each independently an alkyl group, and the alkyl group may be a linear or branched alkyl group having 1 to 24 carbon atoms, 1 to 20 carbon atoms, 1 to 10 carbon atoms, 1 to 8 carbon atoms, 1 to 5 carbon atoms, or 1 to 3 carbon atoms.

When the alkyl group is substituted with another alkyl group, it may also be referred to as "branched alkyl group". A substituent for the alkyl group may include at least one member selected from the group consisting of halo (e.g., F, Cl, Br, I), haloalkyl (e.g., $CCl_3$ or $CF_3$), alkoxy, alkylthio, hydroxy, carboxy (—C(O)—OH), alkyloxy carbonyl (—C(O)—O—R), alkyl carbonyloxy (—O—C(O)—R), amino (—$NH_2$), carbamoyl (—C(O)—NHR), urea (—NH—C(O)—NHR—), and thiol (—SH), but may not be limited thereto. Further, an alkyl group having 2 or more carbon atoms among the above-described alkyl groups may include at least one carbon to carbon double bond or at least one carbon to carbon triple bond, but may not be limited thereto. For example, the alkyl group may include methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, acosanyl, or all the possible isomers thereof, but may not be limited thereto. For example, $R^1$ to $R^4$ and $R^5$ or an alkyl group which can be substituted therefor may be each independently an alkyl group having 1 to 10 carbon atoms, i.e., a methyl group, an ethyl group, a propyl group, a butyl group, a pentyl group, a hexyl group, a heptyl group, an octyl group, a nonyl group or a decyl group, or an alkyl group having 1 to 6 carbon atoms, i.e., a methyl group, an ethyl group, a propyl group, a butyl group, a pentyl group or a hexyl group, or an alkyl group having 1 to 4 carbon atoms, i.e., a methyl group, an ethyl group, an i-propyl group, a n-propyl group, a t-butyl group, a s-butyl group, or a n-butyl group, but may not be limited thereto.

For example, when the alkyl group is substituted, there may be one, two, or three substituents which can be substituted for the alkyl group, but may not be limited thereto. The aryl group among the substituents independently described for each of $R^1$ to $R^{10}$ is a substituted or unsubstituted, monocyclic or bicyclic aromatic group which may have from 6 to 14 carbon atoms, desirably from 6 to 10 carbon atoms in the aromatic ring portion. For example, the aryl group used herein may include a phenyl group, a naphthyl group, an indenyl group, and an indanyl group, but may not be limited thereto. The aryl group may be substituted or may not be substituted. When the aryl group defined above is substituted, its substituent may include one or more substituents selected from the following examples, but may not be limited thereto. The substituent may include an unsubstituted alkyl group having 1 to 6 carbon atoms (forming an aralkyl group), an unsubstituted aryl group, a cyano group, an amino group, an alkyl amino group having 1 to 10 carbon atoms, a dialkyl amino group having 1 to 10 carbon atoms, an aryl amino group, a diaryl amino group, arylalkyl amino group, an amino group, an amide group, a hydroxy group, a halo group, a carboxy group, an ester group, an acyl group, an acyloxy group, an alkoxy group having 1 to 20 carbon atoms, an aryloxy group, a haloalkyl group, a sulfhydryl group (i.e., thiol,—SH), an alkylthio group having 1 to 10 carbon atoms, an arylthio group, a sulfonic acid group, a phosphate group, a phosphate ester group, a phosphonic acid group, and a sulfonyl group, but may not be limited thereto. For example, the substituted aryl group may have one, two, or three substituents, but may not be limited thereto. For example, the substituted aryl group may be substituted in two positions with a single alkylene group having 1 to 6 carbon atoms, or with a bidentate group represented by Chemical Formula [—X—($C_1$-$C_6$)alkylene] or Chemical Formula [—X—($C_1$-$C_6$)alkylene-X—]. Herein, X may be selected from O, S and NR and R may be H, an aryl group or an alkyl group having 1 to 6 carbon atoms. For example, the substituted aryl group may be an aryl group fused with a cycloalkyl group or with a heterocyclyl group. For example, the ring atoms of an aryl group may include one or more heteroatoms as in a heteroaryl group. Such an aryl group or a heteroaryl group is a substituted or unsubstituted mono- or bicyclic heteroaromatic group which contains from 6 to 10 atoms in the ring portion including one or more heteroatoms. For example, a 5- or 6-membered ring may contain at least one heteroatom selected from O, S, N, P, Se and Si. For example, one, two, or three heteroatoms may be contained. For example, the heteroaryl group may include a pyridyl group, a pyrazinyl group, a pyrimidinyl group, a pyridazinyl group, a furanyl group, a thienyl group, a pyrazolidinyl group, a pyrrolyl group, an oxazolyl group, an oxadiazolyl group, an isoxazolyl group, a thiadiazolyl group, a thiazolyl group, an isothiazolyl group, an imidazolyl group, a pyrazolyl group, a quinolyl group, and an isoquinolyl group, but may not be limited thereto. For example, the heteroaryl group may not be substituted or may be substituted as described above for the aryl group. When the heteroaryl group is substituted, there may be, for example, one, two, or three substituents, but may not be limited thereto.

In an embodiment of the present disclosure, in Chemical Formula 1, R may include an alkali metal cation in addition to the organic cation, i.e., a mixed cation of the organic cation and the alkali metal cation, but may not be limited thereto. In this case, a molar ratio of the alkali metal cation to all cations of R in Chemical Formula 1 may be more than 0 to 0.2, but may not be limited thereto. The alkali metal cation may include a cation of a metal selected from the group consisting of Cs, K, Rb, Mg, Ca, Sr, Ba, and combinations thereof, but may not be limited thereto.

In an embodiment of the present disclosure, in Chemical Formula 1, X may include a halide anion or a chalcogenide anion, but may not be limited thereto. For example, in Chemical Formula 1, X may include one kind or two or more kinds of anions, for example, one or more kinds of halide anions, one or more kinds of chalcogenide anions, or mixed anions thereof. For example, in Chemical Formula 1, X may include a member selected from the group consisting of $F^-$, $Cl^-$, $Br^-$, $I^-$, $S^{2-}$, $Se^{2-}$, $Te^{2-}$, and combinations thereof, but may not be limited thereto. For example, in Chemical Formula 1, X may include one or more kinds of anions selected from the group consisting of $F^-$, $Cl^-$, $Br^-$, $I^-$, and combinations thereof as a monovalent halide anion, but may not be limited thereto. For example, in Chemical Formula 1, X may include a member selected from the group consisting of $S^{2-}$, $Se^{2-}$, $Te^{2-}$, and combinations thereof as a divalent chalcogenide anion, but may not be limited thereto.

In an embodiment of the present disclosure, the organic metal halide in Chemical Formula 1 may include a member or two or more members selected from $CH_3NH_3PbI_xCl_y$ (x and y are real numbers satisfying $0 \leq x \leq 3$, $0 \leq y \leq 3$, and $x+y=3$), $CH_3NH_3PbI_xBr_y$ (x and y are real numbers satisfying $0 \leq x \leq 3$, $0 \leq y \leq 3$, and $x+y=3$), $CH_3NH_3PbClBr_y$ (x and y are real numbers satisfying $0 \leq x \leq 3$, $0 \leq y \leq 3$, and $x+y=3$), and $CH_3NH_3PbI_xF_y$ (x and y are real numbers satisfying $0 \leq x \leq 3$, $0 \leq y \leq 3$, and $x+y=3$), and may include a member or two or more members selected from $(CH_3NH_3)_2PbI_xCl_y$ (x and y are real numbers satisfying $0 \leq x \leq 4$, $0 \leq y \leq 4$, and $x+y=4$), $(CH_3NH_3)_2PbI_xBr_y$ (x and y are real numbers satisfying $0 \leq x \leq 4$, $0 \leq y \leq 4$, and $x+y=4$), $(CH_3NH_3)_2PbCl_xBr_y$ (x and y are real numbers satisfying $0 \leq x \leq 4$, $0 \leq y \leq 4$, and $x+y=4$), and $(CH_3NH_3)_2PbI_xF_y$ (x and y are real numbers satisfying $0 \leq x \leq 4$, $0 \leq y \leq 4$, and $x+y=4$), but may not be limited thereto.

In an embodiment of the present disclosure, the organic metal halide in Chemical Formula 1 may include a member or two or more members selected from $CH_3NH_3PbI_3$ (hereafter, also referred to as "MAPbI$_3$"), $CH_3NH_3PbBr_3$ (hereafter, also referred to as "MAPbBr$_3$"), $CH_3NH_3PbCl_3$, $CH_3NH_3PbF_3$, $CH_3NH_3PbBrI_2$, $CH_3NH_3PbBrCl_2$, $CH_3NH_3PbIBr_2$, $CH_3NH_3PbICl_2$, $CH_3NH_3PbClBr_2$, $CH_3NH_3PbI_2Cl$, $CH_3NH_3SnBrI_2$, $CH_3NH_3SnBrCl_2$, $CH_3NH_3SnF_2Br$, $CH_3NH_3SnIBr_2$, $CH_3NH_3SnICl_2$, $CH_3NH_3SnF_2I$, $CH_3NH_3SnClBr_2$, $CH_3NH_3SnI_2Cl$, and $CH_3NH_3SnF_2Cl$, but may not be limited thereto.

For example, the organic metal halide in Chemical Formula 1 may include a member or two or more members selected from $CH_3CH_2NH_3PbI_3$, $CH_3CH_2NH_3PbBr_3$, $CH_3CH_2NH_3PbCl_3$, $CH_3CH_2NH_3PbF_3$, $CH_3CH_2NH_3PbBrI_2$, $CH_3CH_2NH_3PbBrCl_2$, $CH_3CH_2NH_3PbIBr_2$, $CH_3CH_2NH_3PbIC_2$, $CH_3CH_2NH_3PbClBr_2$, $CH_3CH_2NH_3PbI_2Cl$, $CH_3CH_2NH_3SnBrI_2$, $CH_3CH_2NH_3SnBrCl_2$, $CH_3CH_2NH_3SnF_2Br$, $CH_3CH_2NH_3SnIBr_2$, $CH_3CH_2NH_3SnICl_2$, $CH_3CH_2NH_3SnF_2I$, $CH_3CH_2NH_3SnClBr_2$, $CH_3CH_2NH_3SnI_2Cl$, and $CH_3NH_3SnF_2Cl$, but may not be limited thereto.

For example, the organic metal halide in Chemical Formula 1 may include a member or two or more members selected from $CH_3(CH_2)_2NH_3PbI_3$, $CH_3(CH_2)_2NH_3PbBr_3$, $CH_3(CH_2)_2NH_3PbCl_3$, $CH_3(CH_2)_2NH_3PbF_3$, $CH_3(CH_2)_2NH_3PbBrI_2$, $CH_3(CH_2)_2NH_3PbBrCl_2$, $CH_3(CH_2)_2NH_3PbIBr_2$, $CH_3(CH_2)_2NH_3PbICl_2$, $CH_3(CH_2)_2NH_3PbClBr_2$, $CH_3(CH_2)_2NH_3PbI_2Cl$, $CH_3(CH_2)_2NH_3SnF_2Br$, $CH_3(CH_2)_2NH_3SnICl_2$, $CH_3(CH_2)_2NH_3SnF_2I$, $CH_3(CH_2)_2NH_3SnI_2Cl$, and $CH_3(CH_2)_2NH_3SnF_2Cl$, but may not be limited thereto.

For example, the organic metal halide in Chemical Formula 1 may include a member or two or more members selected from $CH_3(CH_2)_3NH_3PbI_3$, $CH_3(CH_2)_3NH_3PbBr_3$, $CH_3(CH_2)_3NH_3PbCl_3$, $CH_3(CH_2)_3NH_3PbF_3$, $CH_3(CH_2)_3PbBrI_2$, $CH_3(CH_2)_3NH_3PbBrCl_2$, $CH_3(CH_2)_3NH_3PbIBr_2$, $CH_3(CH_2)_3NH_3PbICl_2$, $CH_3(CH_2)_3NH_3PbClBr_2$, $CH_3(CH_2)_3NH_3PbI_2Cl$, $CH_3(CH_2)_3NH_3SnF_2Br$, $CH_3(CH_2)_3NH_3SnF_2I$, and $CH_3(CH_2)_3NH_3SnF$—Cl, but may not be limited thereto.

For example, the organic metal halide having the three-dimensional perovskite structure according to an embodiment of the present disclosure may include $CH_3NH_3PbI_3$.

According to an embodiment of the present disclosure, the organic metal halide having the two-dimensional perovskite crystal structure may be represented by the following Chemical Formula 2, but may not be limited thereto:

$$R_2MX_4 \qquad \text{[Chemical Formula 2]}$$

(R is a substituted or unsubstituted $C_{1-24}$ alkyl group, and when R is substituted, its substituent is an amino group, a hydroxyl group, a cyano group, a halogen group, a nitro group, or a methoxy group, M includes a metal cation selected from the group consisting of Pb, Sn, Ge, Cu, Ni, Co, Fe, Mn, Cr, Pd, Cd, Yb, and combinations thereof, and X includes a halide anion or a chalcogenide anion).

In an embodiment of the present disclosure, in Chemical Formula 2, R is a monovalent organic ammonium ion represented by $(R^1R^2R^3R^4N)^+$ and $R^1$ to $R^4$ may each independently include a member selected from the group consisting of a linear or branched alkyl group having 1 to 24 carbon atoms, a cycloalkyl group having 3 to 20 carbon atoms, an aryl group having 6 to 20 carbon atoms, and combinations thereof, but may not be limited thereto.

In an embodiment of the present disclosure, in Chemical Formula 2, R is a monovalent organic ammonium ion represented by $(R^5-NH_3)^+$, and $R^5$ may include a member selected from the group consisting of a linear or branched alkyl group having 1 to 24 carbon atoms, a cycloalkyl group having 3 to 20 carbon atoms, an aryl group having 6 to 20 carbon atoms, and combinations thereof, but may not be limited thereto.

In an embodiment of the present disclosure, in Chemical Formula 2, R may be represented by Chemical Formula $(R^6R^7N=CH-NR^8R^9)^+$, and $R^6$ may be hydrogen, an unsubstituted or substituted alkyl group having 1 to 20 carbon atoms, or an unsubstituted or substituted aryl group; $R^7$ may be hydrogen, an unsubstituted or substituted alkyl group having 1 to 20 carbon atoms, or an unsubstituted or substituted aryl group; $R^8$ may be hydrogen, an unsubstituted or substituted alkyl group having 1 to 20 carbon atoms, or an unsubstituted or substituted aryl group; and $R^9$ may be hydrogen, an unsubstituted or substituted alkyl group having 1 to 20 carbon atoms, or an unsubstituted or substituted aryl group, but may not be limited thereto.

The alky group used herein may be a substituted or unsubstituted, linear or branched chain saturated radical, and it is often a substituted or an unsubstituted linear chain saturated radical and may be, for example, an unsubstituted linear chain saturated radical, but may not be limited thereto. For example, the alkyl group having 1 to 20 carbon atoms used herein may be a substituted or unsubstituted, linear or branched chain saturated hydrocarbon radical, but may not be limited thereto.

When the alkyl group is substituted, its substituent may include one or more substituents selected from the following examples, but may not be limited thereto. The substituent may include an substituted or unsubstituted alkyl group having 1 to 20 carbon atoms, a substituted or unsubstituted aryl group, a cyano group, an amino group, an alkyl amino group having 1 to 10 carbon atoms, a dialkyl amino group having 1 to 10 carbon atoms, an aryl amino group, a diaryl amino group, arylalkyl amino group, an amino group, an amide group, a hydroxy group, an oxo group, a halo group, a carboxy group, an ester group, an acyl group, an acyloxy group, an alkoxy group having 1 to 20 carbon atoms, an aryloxy group, a haloalkyl group, a sulfonic acid group, a sulfone group (i.e., thiol,—SH), an alkylthio group having 1 to 10 carbon atoms, an arylthio group, a sulfonyl group, a phosphate group, a phosphate ester group, a phosphonic acid group, and a phosphonate ester group, but may not be limited thereto. For example, the substituted alkyl group may include a halogen alkyl group, a hydroxy alkyl group, an alkoxy alkyl group, or an alkaryl group, but may not be limited thereto. The alkaryl group pertains to a substituted alkyl group having 1 to 20 carbon atoms and refers to an alkyl group in which at least one hydrogen atom has been substituted with an aryl group. For example, the aryl group that substitutes for the at least one hydrogen atom may include a benzyl group (phenylmethyl, $PhCH_2-$), a benzhydryl group ($Ph_2CH-$), a trityl group (triphenylmethyl, $Ph_3C-$), phenethyl ($Ph-CH_2CH_2-$), a styryl group ($PhCH=CH-$), or a cinnamyl group ($PhCH=CHCH_2-$), but may not be limited thereto.

For example, $R^1$ to $R^{10}$ may be each independently an alkyl group, and the alkyl group may be a linear or branched alkyl group having 1 to 24 carbon atoms, 1 to 20 carbon atoms, 1 to 10 carbon atoms, 1 to 8 carbon atoms, 1 to 5 carbon atoms, or 1 to 3 carbon atoms. When the alkyl group is substituted with another alkyl group, it may also be referred to as "branched alkyl group". A substituent for the alkyl group may include at least one member selected from the group consisting of halo (e.g., F, Cl, Br, I), haloalkyl (e.g., $CCl_3$ or $CF_3$), alkoxy, alkylthio, hydroxy, carboxy (—C(O)—OH), alkyloxy carbonyl (—C(O)—O—R), alkyl carbonyloxy (—O—C(O)—R), amino (—$NH_2$), carbamoyl (—C(O)—NHR), urea (—NH—C(O)—NHR—), and thiol (—SH), but may not be limited thereto. Further, an alkyl group having 2 or more carbon atoms among the above-described alkyl groups may include at least one carbon to carbon double bond or at least one carbon to carbon triple bond, but may not be limited thereto. For example, the alkyl group may include methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, acosanyl, or all the possible isomers thereof, but may not be limited thereto. For example, $R^1$ to $R^4$ and $R^5$ or an alkyl group which can be substituted therefor may be each independently an alkyl group having 1 to 10 carbon atoms, i.e., a methyl group, an ethyl group, a propyl group, a butyl group, a pentyl group, a hexyl group, a heptyl group, an octyl group, a nonyl group or a decyl group, or an alkyl group having 1 to 6 carbon atoms, i.e., a methyl group, an ethyl group, a propyl group, a butyl group, a pentyl group or a hexyl group, or an alkyl group having 1 to 4 carbon atoms, i.e., a methyl group, an ethyl group, an i-propyl group, a n-propyl group, a t-butyl group, a s-butyl group, or a n-butyl group, but may not be limited thereto.

For example, when the alkyl group is substituted, there may be one, two, or three substituents which can be substituted for the alkyl group, but may not be limited thereto. The aryl group among the substituents independently described for each of $R^1$ to $R^{10}$ is a substituted or unsubstituted, monocyclic or bicyclic aromatic group which may have from 6 to 14 carbon atoms, desirably from 6 to 10 carbon atoms in the aromatic ring portion. For example, the aryl group used herein may include a phenyl group, a naphthyl group, an indenyl group, and an indanyl group, but may not be limited thereto. The aryl group may be substituted or may not be substituted. When the aryl group defined above is substituted, its substituent may include one or more substituents selected from the following examples, but may not be limited thereto: an unsubstituted alkyl group having 1 to 6 carbon atoms (forming an aralkyl group), an unsubstituted aryl group, a cyano group, an amino group, an alkyl amino group having 1 to 10 carbon atoms, a dialkyl amino group having 1 to 10 carbon atoms, an aryl amino group, a diaryl amino group, arylalkyl amino group, an amino group, an amide group, a hydroxy group, a halo group, a carboxy group, an ester group, an acyl group, an acyloxy group, an alkoxy group having 1 to 20 carbon atoms, an aryloxy group, a haloalkyl group, a sulfhydryl group (i.e., thiol,—SH), an alkylthio group having 1 to 10 carbon atoms, an arylthio group, a sulfonic acid group, a phosphate group, a phosphate ester group, a phosphonic acid group, and a sulfonyl group. For example, the substituted aryl group may have one, two, or three substituents, but may not be limited thereto. For example, the substituted aryl group may be substituted in two positions with a single alkylene group having 1 to 6 carbon atoms, or with a bidentate group represented by Chemical Formula [—X—$(C_1-C_6)$alkylene] or Chemical Formula [—X—$(C_1-C_6)$alkylene-X—]. Herein, X may be selected from O, S and NR and R may be H, an aryl group or an alkyl group having 1 to 6 carbon atoms. For example, the substituted aryl group may be an aryl group fused with a cycloalkyl group or with a heterocyclyl group. For example, the ring atoms of an aryl group may include one or more heteroatoms as in a heteroaryl group. Such an aryl group or a heteroaryl group is a substituted or unsubstituted mono- or bicyclic heteroaromatic group which contains from 6 to 10 atoms in the ring portion including one or more heteroatoms. For example, a 5- or 6-membered ring may contain at least one heteroatom selected from O, S, N, P, Se and Si. For example, one, two, or three heteroatoms may be contained. For example, the heteroaryl group may include a pyridyl group, a pyrazinyl group, a pyrimidinyl group, a pyridazinyl group, a furanyl group, a thienyl group, a pyrazolidinyl group, a pyrrolyl group, an oxazolyl group, an oxadiazolyl group, an isoxazolyl group, a thiadiazolyl group, a thiazolyl group, an isothiazolyl group, an imidazolyl group, a pyrazolyl group, a quinolyl group, and an isoquinolyl group, but may not be limited thereto. For example, the heteroaryl group may not be substituted or may be substituted as described above for the aryl group. When the heteroaryl group is substituted, there may be, for example, one, two, or three substituents, but may not be limited thereto.

In an embodiment of the present disclosure, in Chemical Formula 2, R may include an alkali metal cation in addition to the organic cation, i.e., a mixed cation of the organic cation and the alkali metal cation, but may not be limited thereto. In this case, a molar ratio of the alkali metal cation to all cations of R in Chemical Formula 2 may be more than 0 to 0.2, but may not be limited thereto. The alkali metal cation may include a cation of a metal selected from the group consisting of Cs, K, Rb, Mg, Ca, Sr, Ba, and combinations thereof, but may not be limited thereto.

In an embodiment of the present disclosure, in Chemical Formula 2, X may include a halide anion or a chalcogenide anion, but may not be limited thereto. For example, in Chemical Formula 2, X may include one kind or two or more kinds of anions, for example, one or more kinds of halide anions, one or more kinds of chalcogenide anions, or mixed anions thereof. For example, in Chemical Formula 2, X may include a member selected from the group consisting of $F^-$, $Cl^-$, $Br^-$, $I^-$, $S^{2-}$, $Se^{2-}$, $Te^{2-}$, and combinations thereof, but may not be limited thereto. For example, in Chemical Formula 2, X may include one or more kinds of anions selected from the group consisting of $F^-$, $Cl^-$, $Br^-$, $I^-$, and combinations thereof as a monovalent halide anion, but may not be limited thereto. For example, in Chemical Formula 2, X may include a member selected from the group consisting of $S^{2-}$, $Se^{2-}$, $Te^{2-}$, and combinations thereof as a divalent chalcogenide anion, but may not be limited thereto.

For example, the organic metal halide having the two-dimensional perovskite crystal structure according to an embodiment of the present disclosure may include $(PEA)_2PbI_4$.

According to an embodiment of the present disclosure, the polymer protective layer 400 may include an ionic conductive polymer selected from the group consisting of polymethyl methacrylate, polyethylene oxide, polypropylene oxide, polydimethylsiloxane, polyacrylonitrile, polyvinyl chloride, polyvinylidene fluoride, polyvinylidene fluoride-hexafluoropropylene, polyethyleneimine, polyphenylene terephthalamide, poly(methoxy polyethylene glycol methacrylate), poly(2-methoxy ethyl glycidyl ether), and combinations thereof, but may not be limited thereto. Desirably, the polymer protective layer may include polymethyl methacrylate.

A second aspect of the present disclosure relates to a preparing method of a resistive random access memory device, including: forming a first electrode 100 on a substrate; forming a first resistance change layer 200, on the first electrode 100, comprising an organic metal halide having a three-dimensional perovskite crystal structure; forming a second resistance change layer 300, on the first resistance change layer 200, comprising an organic metal halide having a two-dimensional perovskite crystal structure; and forming a second electrode 500 on the second resistance change layer 300.

According to an embodiment of the present disclosure, the preparing method may further include forming the polymer protective layer 400 on the second resistance change layer 300, but may not be limited thereto.

Figure 3:
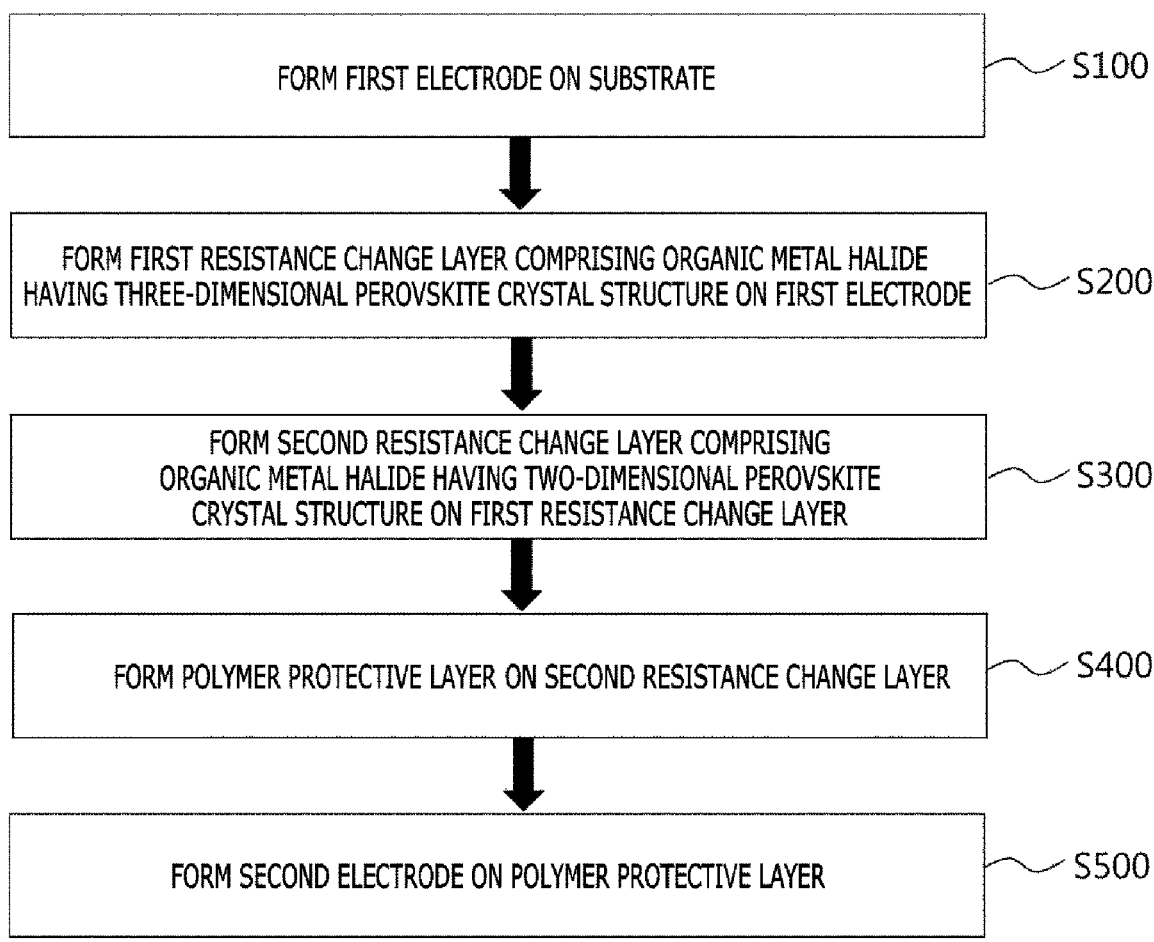
FIG. 3 is a flowchart showing a preparing method of a resistive random access memory device according to an embodiment of the present disclosure.

FIG. 3 is a flowchart showing a preparing method of a resistive random access memory device according to an embodiment of the present disclosure, and FIG. 4 is a schematic diagram showing a process of forming a second resistance change layer on a first resistance change layer in a preparing method of a resistive random access memory device according to an embodiment of the present disclosure.

Hereafter, the preparing method will be described with reference to FIG. 3 and FIG. 4.

Firstly, the first electrode 100 is formed on the substrate (S100).

In an embodiment of the present disclosure, the first electrode 100 may include a material selected from the group consisting of a metal, a conductive polymer, a carbonaceous material, and combinations thereof, but may not be limited thereto.

The metal may include a metal selected from the group consisting of Pt, Ti, Cu, Ni, Sc, V, Cr, Mn, Fe, Co, Zn, Y, Zr, Nb, Mo, Tc, Ru, Rh, Pd, Ag, Cd, Hf, Ta, W, Re, Os, Ir, Au, Hg, Rf, Db, Sg, Bh, Hs, Mt, Ds, Rg, Cn, and combinations thereof, but may not be limited thereto.

The conductive polymer may include a material selected from the group consisting of poly(3,4-ethylenedioxythiophene), poly(3,4-ethylenedioxythiophene) polystyrene sulfonate, polyacetylene, polypyrrole, polythiophene, polyaniline, polyphenylene, polyphenylene sulfide, polyfullerene, and combinations thereof, but may not be limited thereto.

The carbonaceous material may include a carbonaceous material selected from the group consisting of carbon nanotube, graphene, fullerene, carbon nanofiber, and combinations thereof, but may not be limited thereto.

Then, the first resistance change layer 200 comprising the organic metal halide having the three-dimensional perovskite crystal structure is formed on the first electrode 100 (S200).

According to an embodiment of the present disclosure, the forming of the first resistance change layer may be performed by coating, on the first electrode, a solution in which the organic metal halide having the three-dimensional perovskite crystal structure is dissolved in a first solvent, but may not be limited thereto.

The coating may be performed by selecting one from the group consisting of spin-coating, bar-coating, nozzle printing, spray coating, slot die coating, gravure printing, ink-jet printing, screen printing, electrohydrodynamic jet printing, electrospray, and combinations thereof, but may not be limited thereto. Desirably, the coating may be performed by spin-coating.

The spin-coating is a method for coating a thin film of the solution on the substrate by spinning the substrate at high speed, and, thus, the solvent can be volatilized rapidly. Further, the spin-coating is advantageous when coating a low-viscosity solution.

According to an embodiment of the present disclosure, the first solvent may be selected from the group consisting of dimethylformamide, dimethylsulfoxide, dimethylacetamide, N-methylpyrrolidone, N-methyl-2-pyridine, pyridine, aniline, and combinations thereof, but may not be limited thereto. Desirably, the first solvent may include dimethylformamide and dimethylsulfoxide.

According to an embodiment of the present disclosure, the organic metal halide having the three-dimensional perovskite crystal structure may be represented by the following Chemical Formula 3, but may not be limited thereto:

$$RMX_3 \qquad \text{[Chemical Formula 3]}$$

(R is a substituted or unsubstituted $C_{1-24}$ alkyl group, and when R is substituted, its substituent is an amino group, a hydroxyl group, a cyano group, a halogen group, a nitro group, or a methoxy group, M includes a metal cation selected from the group consisting of Pb, Sn, Ge, Cu, Ni, Co, Fe, Mn, Cr, Pd, Cd, Yb, and combinations thereof, and X includes a halide anion or a chalcogenide anion).

In an embodiment of the present disclosure, in Chemical Formula 3, R is a monovalent organic ammonium ion represented by $(R^1R^2R^3R^4N)^+$ and $R^1$ to $R^4$ may each independently include a member selected from the group consisting of a linear or branched alkyl group having 1 to 24 carbon atoms, a cycloalkyl group having 3 to 20 carbon atoms, an aryl group having 6 to 20 carbon atoms, and combinations thereof, but may not be limited thereto.

In an embodiment of the present disclosure, in Chemical Formula 3, R is a monovalent organic ammonium ion represented by $(R^5—NH_3)^+$, and $R^5$ may include a member selected from the group consisting of a linear or branched alkyl group having 1 to 24 carbon atoms, a cycloalkyl group having 3 to 20 carbon atoms, an aryl group having 6 to 20 carbon atoms, and combinations thereof, but may not be limited thereto.

In an embodiment of the present disclosure, in Chemical Formula 3, R may be represented by Chemical Formula $(R^6R^7N=CH—NR^8R^9)^+$, and $R^6$ may be hydrogen, an unsubstituted or substituted alkyl group having 1 to 20 carbon atoms, or an unsubstituted or substituted aryl group; $R^7$ may be hydrogen, an unsubstituted or substituted alkyl group having 1 to 20 carbon atoms, or an unsubstituted or substituted aryl group; $R^8$ may be hydrogen, an unsubstituted or substituted alkyl group having 1 to 20 carbon atoms, or an unsubstituted or substituted aryl group; and $R^9$ may be hydrogen, an unsubstituted or substituted alkyl group having 1 to 20 carbon atoms, or an unsubstituted or substituted aryl group, but may not be limited thereto.

The alky group used herein may be a substituted or unsubstituted, linear or branched chain saturated radical, and it is often a substituted or an unsubstituted linear chain saturated radical and may be, for example, an unsubstituted linear chain saturated radical, but may not be limited thereto. For example, the alkyl group having 1 to 20 carbon atoms used herein may be a substituted or unsubstituted, linear or branched chain saturated hydrocarbon radical, but may not be limited thereto.

When the alkyl group is substituted, its substituent may include one or more substituents selected from the following examples, but may not be limited thereto. The substituent may include an substituted or unsubstituted alkyl group having 1 to 20 carbon atoms, a substituted or unsubstituted aryl group, a cyano group, an amino group, an alkyl amino group having 1 to 10 carbon atoms, a dialkyl amino group having 1 to 10 carbon atoms, an aryl amino group, a diaryl amino group, arylalkyl amino group, an amino group, an amide group, a hydroxy group, an oxo group, a halo group, a carboxy group, an ester group, an acyl group, an acyloxy group, an alkoxy group having 1 to 20 carbon atoms, an aryloxy group, a haloalkyl group, a sulfonic acid group, a sulfone group (i.e., thiol,—SH), an alkylthio group having 1 to 10 carbon atoms, an arylthio group, a sulfonyl group, a phosphate group, a phosphate ester group, a phosphonic acid group, and a phosphonate ester group, but may not be limited thereto. For example, the substituted alkyl group may include a halogen alkyl group, a hydroxy alkyl group, an alkoxy alkyl group, or an alkaryl group, but may not be limited thereto. The alkaryl group pertains to a substituted alkyl group having 1 to 20 carbon atoms and refers to an alkyl group in which at least one hydrogen atom has been substituted with an aryl group. For example, the aryl group that substitutes for the at least one hydrogen atom may include a benzyl group (phenylmethyl, $PhCH_2$—), a benzhydryl group ($Ph_2CH$—), a trityl group (triphenylmethyl, $Ph_3C$—), phenethyl ($Ph-CH_2CH_2$—), a styryl group ($PhCH=CH$—), or a cinnamyl group ($PhCH=CHCH_2$—), but may not be limited thereto.

For example, $R^1$ to $R^{10}$ may be each independently an alkyl group, and the alkyl group may be a linear or branched alkyl group having 1 to 24 carbon atoms, 1 to 20 carbon atoms, 1 to 10 carbon atoms, 1 to 8 carbon atoms, 1 to 5 carbon atoms, or 1 to 3 carbon atoms.

When the alkyl group is substituted with another alkyl group, it may also be referred to as "branched alkyl group". A substituent for the alkyl group may include at least one member selected from the group consisting of halo (e.g., F, Cl, Br, I), haloalkyl (e.g., $CCl_3$ or $CF_3$), alkoxy, alkylthio, hydroxy, carboxy (—C(O)—OH), alkyloxy carbonyl (—C(O)—O—R), alkyl carbonyloxy (—O—C(O)—R), amino (—$NH_2$), carbamoyl (—C(O)—NHR), urea (—NH—C(O)—NHR—), and thiol (—SH), but may not be limited thereto. Further, an alkyl group having 2 or more carbon atoms among the above-described alkyl groups may include at least one carbon to carbon double bond or at least one carbon to carbon triple bond, but may not be limited thereto. For example, the alkyl group may include methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, acosanyl, or all the possible isomers thereof, but may not be limited thereto. For example, $R^1$ to $R^4$ and $R^5$ or an alkyl group which can be substituted therefor may be each independently an alkyl group having 1 to 10 carbon atoms, i.e., a methyl group, an ethyl group, a propyl group, a butyl group, a pentyl group, a hexyl group, a heptyl group, an octyl group, a nonyl group or a decyl group, or an alkyl group having 1 to 6 carbon atoms, i.e., a methyl group, an ethyl group, a propyl group, a butyl group, a pentyl group or a hexyl group, or an alkyl group having 1 to 4 carbon atoms, i.e., a methyl group, an ethyl group, an i-propyl group, a n-propyl group, a t-butyl group, a s-butyl group, or a n-butyl group, but may not be limited thereto.

For example, when the alkyl group is substituted, there may be one, two, or three substituents which can be substituted for the alkyl group, but may not be limited thereto. The aryl group among the substituents independently described for each of $R^1$ to $R^{10}$ is a substituted or unsubstituted, monocyclic or bicyclic aromatic group which may have from 6 to 14 carbon atoms, desirably from 6 to 10 carbon atoms in the aromatic ring portion. For example, the aryl group used herein may include a phenyl group, a naphthyl group, an indenyl group, and an indanyl group, but may not be limited thereto. The aryl group may be substituted or may not be substituted. When the aryl group defined above is substituted, its substituent may include one or more substituents selected from the following examples, but may not be limited thereto. The substituent may include an unsubstituted alkyl group having 1 to 6 carbon atoms (forming an aralkyl group), an unsubstituted aryl group, a cyano group, an amino group, an alkyl amino group having 1 to 10 carbon atoms, a dialkyl amino group having 1 to 10 carbon atoms, an aryl amino group, a diaryl amino group, arylalkyl amino group, an amino group, an amide group, a hydroxy group, a halo group, a carboxy group, an ester group, an acyl group, an acyloxy group, an alkoxy group having 1 to 20 carbon atoms, an aryloxy group, a haloalkyl group, a sulfhydryl group (i.e., thiol,—SH), an alkylthio group having 1 to 10 carbon atoms, an arylthio group, a sulfonic acid group, a phosphate group, a phosphate ester group, a phosphonic acid group, and a sulfonyl group, but may not be limited thereto. For example, the substituted aryl group may have one, two, or three substituents, but may not be limited thereto. For example, the substituted aryl group may be substituted in two positions with a single alkylene group having 1 to 6 carbon atoms, or with a bidentate group represented by Chemical Formula [—X—($C_1$-$C_6$)alkylene] or Chemical Formula [—X—($C_1$-$C_6$)alkylene-X—]. Herein, X may be selected from O, S and NR and R may be H, an aryl group or an alkyl group having 1 to 6 carbon atoms. For example, the substituted aryl group may be an aryl group fused with a cycloalkyl group or with a heterocyclyl group. For example, the ring atoms of an aryl group may include one or more heteroatoms as in a heteroaryl group. Such an aryl group or a heteroaryl group is a substituted or unsubstituted mono- or bicyclic heteroaromatic group which contains from 6 to 10 atoms in the ring portion including one or more heteroatoms. For example, a 5- or 6-membered ring may contain at least one heteroatom selected from O, S, N, P, Se and Si. For example, one, two, or three heteroatoms may be contained. For example, the heteroaryl group may include a pyridyl group, a pyrazinyl group, a pyrimidinyl group, a pyridazinyl group, a furanyl group, a thienyl group, a pyrazolidinyl group, a pyrrolyl group, an oxazolyl group, an oxadiazolyl group, an isoxazolyl group, a thiadiazolyl group, a thiazolyl group, an isothiazolyl group, an imidazolyl group, a pyrazolyl group, a quinolyl group, and an isoquinolyl group, but may not be limited thereto. For example, the heteroaryl group may not be substituted or may be substituted as described above for the aryl group. When the heteroaryl group is substituted, there may be, for example, one, two, or three substituents, but may not be limited thereto.

In an embodiment of the present disclosure, in Chemical Formula 3, R may include an alkali metal cation in addition to the organic cation, i.e., a mixed cation of the organic cation and the alkali metal cation, but may not be limited thereto. In this case, a molar ratio of the alkali metal cation to all cations of R in Chemical Formula 3 may be more than 0 to 0.2, but may not be limited thereto. The alkali metal cation may include a cation of a metal selected from the group consisting of Cs, K, Rb, Mg, Ca, Sr, Ba, and combinations thereof, but may not be limited thereto.

In an embodiment of the present disclosure, in Chemical Formula 3, X may include a halide anion or a chalcogenide anion, but may not be limited thereto. For example, in Chemical Formula 3, X may include one kind or two or more kinds of anions, for example, one or more kinds of halide anions, one or more kinds of chalcogenide anions, or mixed anions thereof. For example, in Chemical Formula 3, X may include a member selected from the group consisting of $F^-$, $Cl^-$, $Br^-$, $I^-$, $S^{2-}$, $Se^{2-}$, $Te^{2-}$, and combinations thereof, but may not be limited thereto. For example, in Chemical Formula 3, X may include one or more kinds of anions selected from the group consisting of $F^-$, $Cl^-$, $Br^-$, $I^-$, and combinations thereof as a monovalent halide anion, but may not be limited thereto. For example, in Chemical Formula 3, X may include a member selected from the group consisting of $S^{2-}$, $Se^{2-}$, $Te^{2-}$, and combinations thereof as a divalent chalcogenide anion, but may not be limited thereto.

In an embodiment of the present disclosure, the organic metal halide in Chemical Formula 3 may include a member or two or more members selected from $CH_3NH_3PbI_xCl_y$ (x and y are real numbers satisfying $0 \le x \le 3$, $0 \le y \le 3$, and x+y=3), $CH_3NH_3PbI_xBr_y$ (x and y are real numbers satisfying $0 \le x \le 3$, $0 \le y \le 3$, and x+y=3), $CH_3NH_3PbClBr_y$ (x and y are real numbers satisfying $0 \le x \le 3$, $0 \le y \le 3$, and x+y=3), and $CH_3NH_3PbI_xF_y$ (x and y are real numbers satisfying $0 \le x \le 3$, $0 \le y \le 3$, and x+y=3), and may include a member or two or more members selected from $(CH_3NH_3)_2PbI_xCl_y$ (x and y are real numbers satisfying $0 \le x \le 4$, $0 \le y \le 4$, and x+y=4), $(CH_3NH_3)_2PbI_xBr_y$ (x and y are real numbers satisfying $0 \le x \le 4$, $0 \le y \le 4$, and x+y=4), $(CH_3NH_3)_2PbClBr_y$ (x and y are real numbers satisfying $0 \le x \le 4$, $0 \le y \le 4$, and x+y=4), and $(CH_3NH_3)_2PbI_xF_y$ (x and y are real numbers satisfying $0 \le x \le 4$, $0 \le y \le 4$, and x+y=4), but may not be limited thereto.

In an embodiment of the present disclosure, the organic metal halide in Chemical Formula 3 may include a member or two or more members selected from $CH_3NH_3PbI_3$ (hereafter, also referred to as "$MAPbI_3$"), $CH_3NH_3PbBr_3$ (hereafter, also referred to as "$MAPbBr_3$"), $CH_3NH_3PbCl_3$, $CH_3NH_3PbF_3$, $CH_3NH_3PbBrI_2$, $CH_3NH_3PbBrCl_2$, $CH_3NH_3PbIBr_2$, $CH_3NH_3PbICl_2$, $CH_3NH_3PbClBr_2$, $CH_3NH_3PbI_2Cl$, $CH_3NH_3SnBrI_2$, $CH_3NH_3SnBrCl_2$, $CH_3NH_3SnF_2Br$, $CH_3NH_3SnIBr_2$, $CH_3NH_3SnICl_2$, $CH_3NH_3SnF_2I$, $CH_3NH_3SnClBr_2$, $CH_3NH_3SnI_2Cl$, and $CH_3NH_3SnF_2Cl$, but may not be limited thereto.

For example, the organic metal halide in Chemical Formula 3 may include a member or two or more members selected from $CH_3CH_2NH_3PbI_3$, $CH_3CH_2NH_3PbBr_3$, $CH_3CH_2NH_3PbCl_3$, $CH_3CH_2NH_3PbF_3$, $CH_3CH_2NH_3PbBrI_2$, $CH_3CH_2NH_3PbBrCl_2$, $CH_3CH_2NH_3PbIBr_2$, $CH_3CH_2NH_3PbIC_2$, $CH_3CH_2NH_3PbClBr_2$, $CH_3CH_2NH_3PbI_2Cl$, $CH_3CH_2NH_3SnBrI_2$, $CH_3CH_2NH_3SnBrCl_2$, $CH_3CH_2NH_3SnF_2Br$, $CH_3CH_2NH_3SnIBr_2$, $CH_3CH_2NH_3SnICl_2$, $CH_3CH_2NH_3SnF_2I$, $CH_3CH_2NH_3SnClBr_2$, $CH_3CH_2NH_3SnI_2Cl$, and $CH_3NH_3SnF_2Cl$, but may not be limited thereto.

For example, the organic metal halide in Chemical Formula 3 may include a member or two or more members selected from $CH_3(CH_2)_2NH_3PbI_3$, $CH_3(CH_2)_2NH_3PbBr_3$, $CH_3(CH_2)_2NH_3PbCl_3$, $CH_3(CH_2)_2NH_3PbF_3$, $CH_3(CH_2)_2NH_3PbBrI_2$, $CH_3(CH_2)_2NH_3PbBrCl_2$, $CH_3(CH_2)_2NH_3PbIBr_2$, $CH_3(CH_2)_2NH_3PbICl_2$, $CH_3(CH_2)_2NH_3PbClBr_2$, $CH_3(CH_2)_2NH_3PbI_2Cl$, $CH_3(CH_2)_2NH_3SnF_2Br$, $CH_3(CH_2)_2NH_3SnICl_2$, $CH_3(CH_2)_2NH_3SnF_2I$, $CH_3(CH_2)_2NH_3SnI_2Cl$, and $CH_3(CH_2)_2NH_3SnF_2Cl$, but may not be limited thereto.

For example, the organic metal halide in Chemical Formula 3 may include a member or two or more members selected from $CH_3(CH_2)_3NH_3PbI_3$, $CH_3(CH_2)_3NH_3PbBr_3$, $CH_3(CH_2)_3NH_3PbCl_3$, $CH_3(CH_2)_3NH_3PbF_3$, $CH_3(CH_2)_3PbBrI_2$, $CH_3(CH_2)_3NH_3PbBrCl_2$, $CH_3(CH_2)_3NH_3PbIBr_2$, $CH_3(CH_2)_3NH_3PbICl_2$, $CH_3(CH_2)_3NH_3PbClBr_2$, $CH_3(CH_2)_3NH_3PbI_2Cl$, $CH_3(CH_2)_3NH_3SnF_2Br$, $CH_3(CH_2)_3NH_3SnF_2I$, and $CH_3(CH_2)_3NH_3SnF$—Cl, but may not be limited thereto.

For example, the organic metal halide having the three-dimensional perovskite structure according to an embodiment of the present disclosure may include $CH_3NH_3PbI_3$.

Then, the second resistance change layer 300 comprising the organic metal halide having the two-dimensional perovskite crystal structure is formed on the first resistance change layer 200 (S300).

Referring to FIG. 4, according to an embodiment of the present disclosure, the second resistance change layer 300 may be formed to have the two-dimensional perovskite crystal structure by coating, on the first resistance change layer 200, a solution in which an organic halide is dissolved in a second solvent and partially melting some of the three-dimensional perovskite crystals with the second solvent, but may not be limited thereto.

The organic halide may be selected from $PhEtNH_3I$, $MeNH_3I$, $PhEtNH_3Cl$, $MeNH_3Cl$, $PhEtNH_3Br$, $MeNH_3Br$, and combinations thereof, but may not be limited thereto. Desirably, the organic halide may include $PhEtNH_3I$.

According to an embodiment of the present disclosure, the second solvent may be a protic solvent including branched alcohols having 3 to 6 carbon atoms, but may not be limited thereto. Desirably, the second solvent may include isopropyl alcohol.

The second solvent may not include a polar aprotic solvent. If an aprotic solvent is used as the second solvent, all the three-dimensional perovskite crystals on the first resistance change layer may be melted, and, thus, a heterojunction structure of the two-dimensional perovskite crystals cannot be formed thereon.

The coating may be performed by selecting one from the group consisting of spin-coating, bar-coating, nozzle printing, spray coating, slot die coating, gravure printing, ink-jet printing, screen printing, electrohydrodynamic jet printing, electrospray, and combinations thereof, but may not be limited thereto. Desirably, the coating may be performed by spin-coating.

The spin-coating is a method for coating a thin film of the solution on the substrate by spinning the substrate at high speed, and, thus, the solvent can be volatilized rapidly. Further, the spin-coating is advantageous when coating a low-viscosity solution.

According to an embodiment of the present disclosure, the organic metal halide having the two-dimensional perovskite crystal structure may be represented by the following Chemical Formula 4, but may not be limited thereto:

$R_2MX_4$ [Chemical Formula 4]

(R is a substituted or unsubstituted $C_{1-24}$ alkyl group, and when R is substituted, its substituent is an amino group, a hydroxyl group, a cyano group, a halogen group, a nitro group, or a methoxy group, M includes a metal cation selected from the group consisting of Pb, Sn, Ge, Cu, Ni, Co, Fe, Mn, Cr, Pd, Cd, Yb, and combinations thereof, and X includes a halide anion or a chalcogenide anion).

In an embodiment of the present disclosure, in Chemical Formula 4, R is a monovalent organic ammonium ion represented by $(R^1R^2R^3R^4N)^+$ and $R^1$ to $R^4$ may each independently include a member selected from the group consisting of a linear or branched alkyl group having 1 to 24 carbon atoms, a cycloalkyl group having 3 to 20 carbon atoms, an aryl group having 6 to 20 carbon atoms, and combinations thereof, but may not be limited thereto.

In an embodiment of the present disclosure, in Chemical Formula 4, R is a monovalent organic ammonium ion represented by $(R^5—NH_3)^+$, and $R^5$ may include a member selected from the group consisting of a linear or branched alkyl group having 1 to 24 carbon atoms, a cycloalkyl group having 3 to 20 carbon atoms, an aryl group having 6 to 20 carbon atoms, and combinations thereof, but may not be limited thereto.

In an embodiment of the present disclosure, in Chemical Formula 4, R may be represented by Chemical Formula $(R^6R^7N=CH—NR^8R^9)^+$, and $R^6$ may be hydrogen, an unsubstituted or substituted alkyl group having 1 to 20 carbon atoms, or an unsubstituted or substituted aryl group; $R^7$ may be hydrogen, an unsubstituted or substituted alkyl group having 1 to 20 carbon atoms, or an unsubstituted or substituted aryl group; $R^8$ may be hydrogen, an unsubstituted or substituted alkyl group having 1 to 20 carbon atoms, or an unsubstituted or substituted aryl group; and $R^9$ may be hydrogen, an unsubstituted or substituted alkyl group having 1 to 20 carbon atoms, or an unsubstituted or substituted aryl group, but may not be limited thereto.

The alky group used herein may be a substituted or unsubstituted, linear or branched chain saturated radical, and it is often a substituted or an unsubstituted linear chain saturated radical and may be, for example, an unsubstituted linear chain saturated radical, but may not be limited thereto. For example, the alkyl group having 1 to 20 carbon atoms used herein may be a substituted or unsubstituted, linear or branched chain saturated hydrocarbon radical, but may not be limited thereto.

When the alkyl group is substituted, its substituent may include one or more substituents selected from the following examples, but may not be limited thereto. The substituent may include an substituted or unsubstituted alkyl group having 1 to 20 carbon atoms, a substituted or unsubstituted aryl group, a cyano group, an amino group, an alkyl amino group having 1 to 10 carbon atoms, a dialkyl amino group having 1 to 10 carbon atoms, an aryl amino group, a diaryl amino group, arylalkyl amino group, an amino group, an amide group, a hydroxy group, an oxo group, a halo group, a carboxy group, an ester group, an acyl group, an acyloxy group, an alkoxy group having 1 to 20 carbon atoms, an aryloxy group, a haloalkyl group, a sulfonic acid group, a sulfone group (i.e., thiol,—SH), an alkylthio group having 1 to 10 carbon atoms, an arylthio group, a sulfonyl group, a phosphate group, a phosphate ester group, a phosphonic acid group, and a phosphonate ester group, but may not be limited thereto. For example, the substituted alkyl group may include a halogen alkyl group, a hydroxy alkyl group, an alkoxy alkyl group, or an alkaryl group, but may not be limited thereto. The alkaryl group pertains to a substituted alkyl group having 1 to 20 carbon atoms and refers to an alkyl group in which at least one hydrogen atom has been substituted with an aryl group. For example, the aryl group that substitutes for the at least one hydrogen atom may include a benzyl group (phenylmethyl, $PhCH_2—$), a benzhydryl group ($Ph_2CH—$), a trityl group (triphenylmethyl, $Ph_3C—$), phenethyl ($Ph-CH_2CH_2—$), a styryl group ($PhCH=CH—$), or a cinnamyl group ($PhCH=CHCH_2—$), but may not be limited thereto.

For example, $R^1$ to $R^{10}$ may be each independently an alkyl group, and the alkyl group may be a linear or branched alkyl group having 1 to 24 carbon atoms, 1 to 20 carbon atoms, 1 to 10 carbon atoms, 1 to 8 carbon atoms, 1 to 5 carbon atoms, or 1 to 3 carbon atoms.

When the alkyl group is substituted with another alkyl group, it may also be referred to as "branched alkyl group". A substituent for the alkyl group may include at least one member selected from the group consisting of halo (e.g., F, Cl, Br, I), haloalkyl (e.g., $CCl_3$ or $CF_3$), alkoxy, alkylthio, hydroxy, carboxy (—C(O)—OH), alkyloxy carbonyl (—C(O)—O—R), alkyl carbonyloxy (—O—C(O)—R), amino (—NH$_2$), carbamoyl (—C(O)—NHR), urea (—NH—C(O)—NHR—), and thiol (—SH), but may not be limited thereto. Further, an alkyl group having 2 or more carbon atoms among the above-described alkyl groups may include at least one carbon to carbon double bond or at least one carbon to carbon triple bond, but may not be limited thereto. For example, the alkyl group may include methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, acosanyl, or all the possible isomers thereof, but may not be limited thereto. For example, $R^1$ to $R^4$ and $R^5$ or an alkyl group which can be substituted therefor may be each independently an alkyl group having 1 to 10 carbon atoms, i.e., a methyl group, an ethyl group, a propyl group, a butyl group, a pentyl group, a hexyl group, a heptyl group, an octyl group, a nonyl group or a decyl group, or an alkyl group having 1 to 6 carbon atoms, i.e., a methyl group, an ethyl group, a propyl group, a butyl group, a pentyl group or a hexyl group, or an alkyl group having 1 to 4 carbon atoms, i.e., a methyl group, an ethyl group, an i-propyl group, a n-propyl group, a t-butyl group, a s-butyl group, or a n-butyl group, but may not be limited thereto.

For example, when the alkyl group is substituted, there may be one, two, or three substituents which can be substituted for the alkyl group, but may not be limited thereto. The aryl group among the substituents independently described for each of $R^1$ to $R^{10}$ is a substituted or unsubstituted, monocyclic or bicyclic aromatic group which may have from 6 to 14 carbon atoms, desirably from 6 to 10 carbon atoms in the aromatic ring portion. For example, the aryl group used herein may include a phenyl group, a naphthyl group, an indenyl group, and an indanyl group, but may not be limited thereto. The aryl group may be substituted or may not be substituted. When the aryl group defined above is substituted, its substituent may include one or more substituents selected from the following examples, but may not be limited thereto. The substituent may include an unsubstituted alkyl group having 1 to 6 carbon atoms (forming an aralkyl group), an unsubstituted aryl group, a cyano group, an amino group, an alkyl amino group having 1 to 10 carbon atoms, a dialkyl amino group having 1 to 10 carbon atoms, an aryl amino group, a diaryl amino group, arylalkyl amino group, an amino group, an amide group, a hydroxy group, a halo group, a carboxy group, an ester group, an acyl group, an acyloxy group, an alkoxy group having 1 to 20 carbon atoms, an aryloxy group, a haloalkyl group, a sulfhydryl group (i.e., thiol,—SH), an alkylthio group having 1 to 10 carbon atoms, an arylthio group, a sulfonic acid group, a phosphate group, a phosphate ester group, a phosphonic acid group, and a sulfonyl group, but may not be limited thereto. For example, the substituted aryl group may have one, two, or three substituents, but may not be limited thereto. For example, the substituted aryl group may be substituted in two positions with a single alkylene group having 1 to 6 carbon atoms, or with a bidentate group represented by Chemical Formula [—X—(C$_1$-C$_6$)alkylene] or Chemical Formula [—X—(C$_1$-C$_6$)alkylene-X—]. Herein, X may be selected from O, S and NR and R may be H, an aryl group or an alkyl group having 1 to 6 carbon atoms. For example, the substituted aryl group may be an aryl group fused with a cycloalkyl group or with a heterocyclyl group. For example, the ring atoms of an aryl group may include one or more heteroatoms as in a heteroaryl group. Such an aryl group or a heteroaryl group is a substituted or unsubstituted mono- or bicyclic heteroaromatic group which contains from 6 to 10 atoms in the ring portion including one or more heteroatoms. For example, a 5- or 6-membered ring may contain at least one heteroatom selected from O, S, N, P, Se and Si. For example, one, two, or three heteroatoms may be contained. For example, the heteroaryl group may include a pyridyl group, a pyrazinyl group, a pyrimidinyl group, a pyridazinyl group, a furanyl group, a thienyl group, a pyrazolidinyl group, a pyrrolyl group, an oxazolyl group, an oxadiazolyl group, an isoxazolyl group, a thiadiazolyl group, a thiazolyl group, an isothiazolyl group, an imidazolyl group, a pyrazolyl group, a quinolyl group, and an isoquinolyl group, but may not be limited thereto. For example, the heteroaryl group may not be substituted or may be substituted as described above for the aryl group. When the heteroaryl group is substituted, there may be, for example, one, two, or three substituents, but may not be limited thereto.

In an embodiment of the present disclosure, in Chemical Formula 4, R may include an alkali metal cation in addition to the organic cation, i.e., a mixed cation of the organic cation and the alkali metal cation, but may not be limited thereto. In this case, a molar ratio of the alkali metal cation to all cations of R in Chemical Formula 4 may be more than 0 to 0.2, but may not be limited thereto. The alkali metal cation may include a cation of a metal selected from the group consisting of Cs, K, Rb, Mg, Ca, Sr, Ba, and combinations thereof, but may not be limited thereto.

In an embodiment of the present disclosure, in Chemical Formula 4, X may include a halide anion or a chalcogenide anion, but may not be limited thereto. For example, in Chemical Formula 4, X may include one kind or two or more kinds of anions, for example, one or more kinds of halide anions, one or more kinds of chalcogenide anions, or mixed anions thereof. For example, in Chemical Formula 4, X may include a member selected from the group consisting of F$^-$, Cl$^-$, Br—, I$^-$, S$^{2-}$—, Se$^{2-}$, Te$^{2-}$, and combinations thereof, but may not be limited thereto. For example, in Chemical Formula 4, X may include one or more kinds of anions selected from the group consisting of F$^-$, Cl$^-$, Br$^-$, I$^-$, and combinations thereof as a monovalent halide anion, but may not be limited thereto. For example, in Chemical Formula 4, X may include a member selected from the group consisting of S$^{2-}$, Se$^{2-}$, Te$^{2-}$, and combinations thereof as a divalent chalcogenide anion, but may not be limited thereto.

For example, the organic metal halide having the two-dimensional perovskite crystal structure according to an embodiment of the present disclosure may include (PEA)$_2$PbI$_4$.

After the second resistance change layer 300 is formed, impurities may be removed by spin-coating a wash liquid on the second resistance change layer 300.

Then, the polymer protective layer 400 is formed on the second resistance change layer 300 (S400).

The polymer protective layer 400 may be formed by spin-coating, on the second resistance change layer 300, an ionic conductive polymer selected from the group consisting of polymethyl methacrylate, polyethylene oxide, polypropylene oxide, polydimethylsiloxane, polyacrylonitrile, polyvinyl chloride, polyvinylidene fluoride, polyvinylidene fluoride-hexafluoropropylene, polyethyleneimine, polyphenylene terephthalamide, poly(methoxy polyethylene glycol methacrylate), poly(2-methoxy ethyl glycidyl ether), and combinations thereof, but may not be limited thereto. Desirably, the polymer protective layer 400 may be formed by spin-coating polymethyl methacrylate on the second resistance change layer 300.

Then, the second electrode 500 is formed on the polymer protective layer 400 (S500).

In an embodiment of the present disclosure, the second electrode 500 may include a material selected from the group consisting of a metal, a conductive polymer, a carbonaceous material, and combinations thereof, but may not be limited thereto.

The metal may include a metal selected from the group consisting of Pt, Ti, Cu, Ni, Sc, V, Cr, Mn, Fe, Co, Zn, Y, Zr, Nb, Mo, Tc, Ru, Rh, Pd, Ag, Cd, Hf, Ta, W, Re, Os, Ir, Au, Hg, Rf, Db, Sg, Bh, Hs, Mt, Ds, Rg, Cn, and combinations thereof, but may not be limited thereto.

The conductive polymer may include a material selected from the group consisting of poly(3,4-ethylenedioxythiophene), poly(3,4-ethylenedioxythiophene) polystyrene sulfonate, polyacetylene, polypyrrole, polythiophene, polyaniline, polyphenylene, polyphenylene sulfide, polyfullerene, and combinations thereof, but may not be limited thereto.

The carbonaceous material may include a carbonaceous material selected from the group consisting of carbon nanotube, graphene, fullerene, carbon nanofiber, and combinations thereof, but may not be limited thereto.

Hereafter, the present disclosure will be described in more detail with reference to examples. The following examples are provided only for explanation, but do not intend to limit the scope of the present disclosure.

Example Preparation of Resistive Random Access Memory Device

Firstly, a hydrophilic group was formed on a surface of a silicon substrate on which a Pt/Ti electrode was deposited by performing UV ozone treatment thereto. Then, a mixed solution in which $CH_3NH_3I$ and $PbI_2$ were dissolved and mixed at a molar ratio of 1:1 to a concentration of 55 wt % in dimethylformamide and dimethyl sulfoxide. The mixed solution was spin-coated on the substrate to form a first resistance change layer.

Then, a solution in which $PhEtNH_3I$ was dissolved in 20 mg/ml of isopropyl alcohol was spin-coated on the first resistance change layer to form a second resistance change layer.

Then, a solution in which polymethyl methacrylate was dissolved in 2 mg/ml of chlorobenzene was spin-coated on the second resistance change layer to form a polymer protective layer.

A second electrode was formed by depositing silver to 50 nm or more on the polymer protective layer under $10^{-6}$ torr.

Comparative Example

In order to check how a heterojunction structure of a three-dimensional perovskite crystal structure and a two-dimensional perovskite crystal structure, which is the greatest feature of the present disclosure, affects the characteristics of a resistive random access memory device, a resistance change layer was prepared as Comparative Example. The resistance change layer was prepared in the same manner as in Example except the formation of the second resistance change layer.

Test Example

Figure 5A:
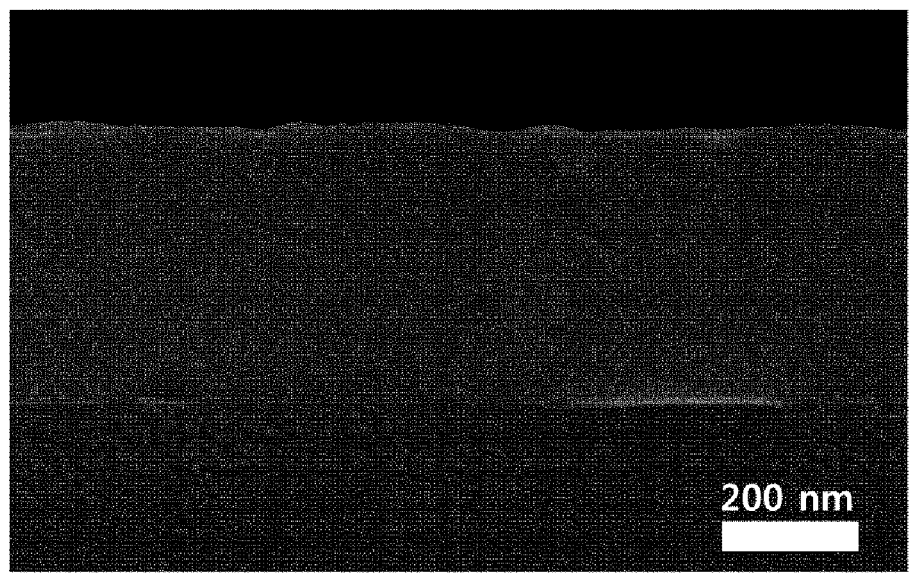
FIG. 5A and FIG. 5B are scanning electron microscopic images showing a cross-section and a surface of a resistance change layer of a resistive random access memory device prepared according to a comparative example of the present disclosure.
Figure 5B:
Figure 6A:
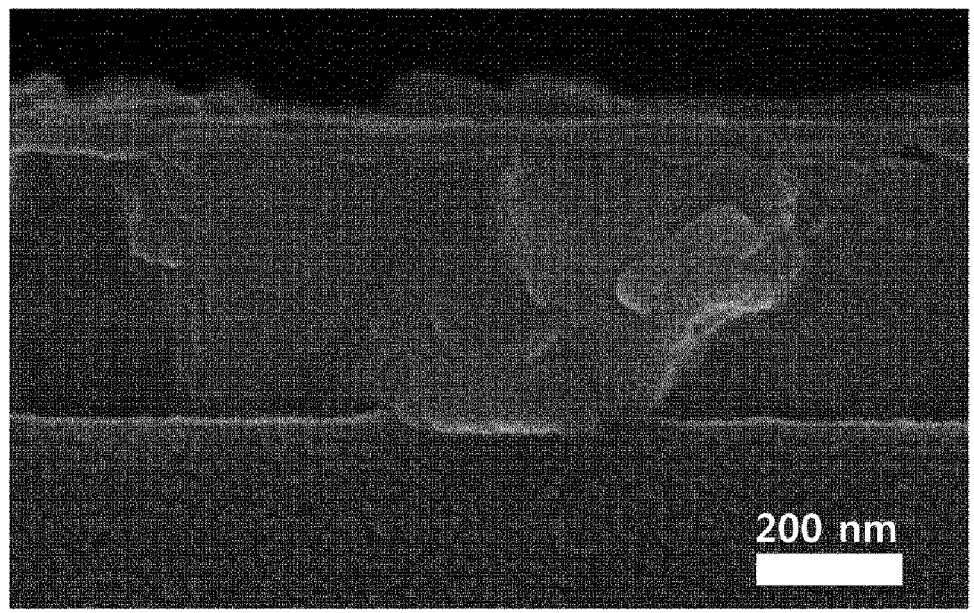
FIG. 6A and FIG. 6B are scanning electron microscopic images showing a cross-section and a surface of a resistance change layer of a resistive random access memory device prepared according to an example of the present disclosure.
Figure 6B:
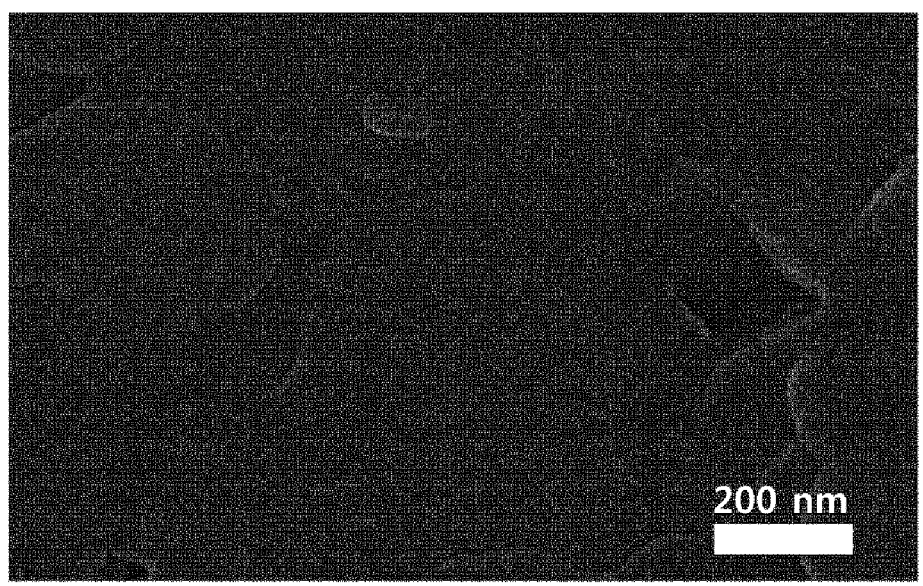

FIG. 5A and FIG. 5B are scanning electron microscopic images showing a cross-section (FIG. 5A) and a surface (FIG. 5B) of a resistance change layer of a resistive random access memory device prepared according to Comparative Example of the present disclosure, and FIG. 6A and FIG. 6B are scanning electron microscopic images showing a cross-section (FIG. 6A) and a surface (FIG. 6B) of a resistance change layer of a resistive random access memory device prepared according to Example of the present disclosure.

Referring to FIG. 5A, FIG. 5B, FIG. 6A and FIG. 6B, it was confirmed from FIG. 5A and FIG. 5B that a perovskite thin film having a monostructure was formed, and it was confirmed from FIG. 6A and FIG. 6B that a heterostructure including a perovskite thin film having a small thickness on a conventional perovskite thin film was formed.

Figure 7A:
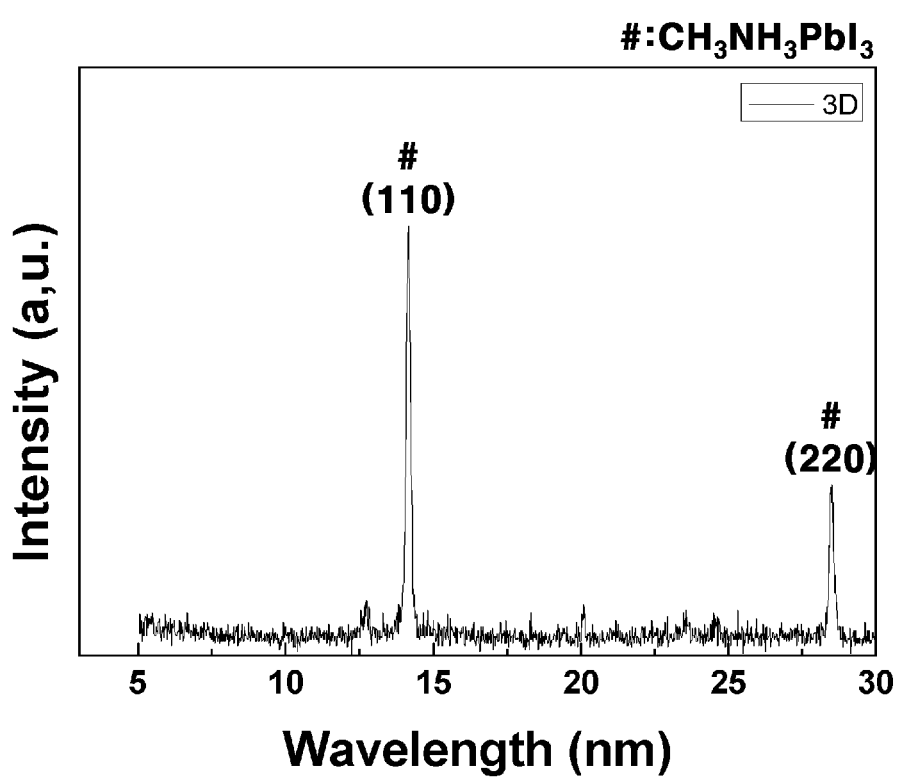
FIG. 7A and FIG. 7B are X-ray diffraction (XRD) graphs before and after a resistive random access memory device prepared according to a comparative example of the present disclosure is exposed to moisture and light.
Figure 7B:
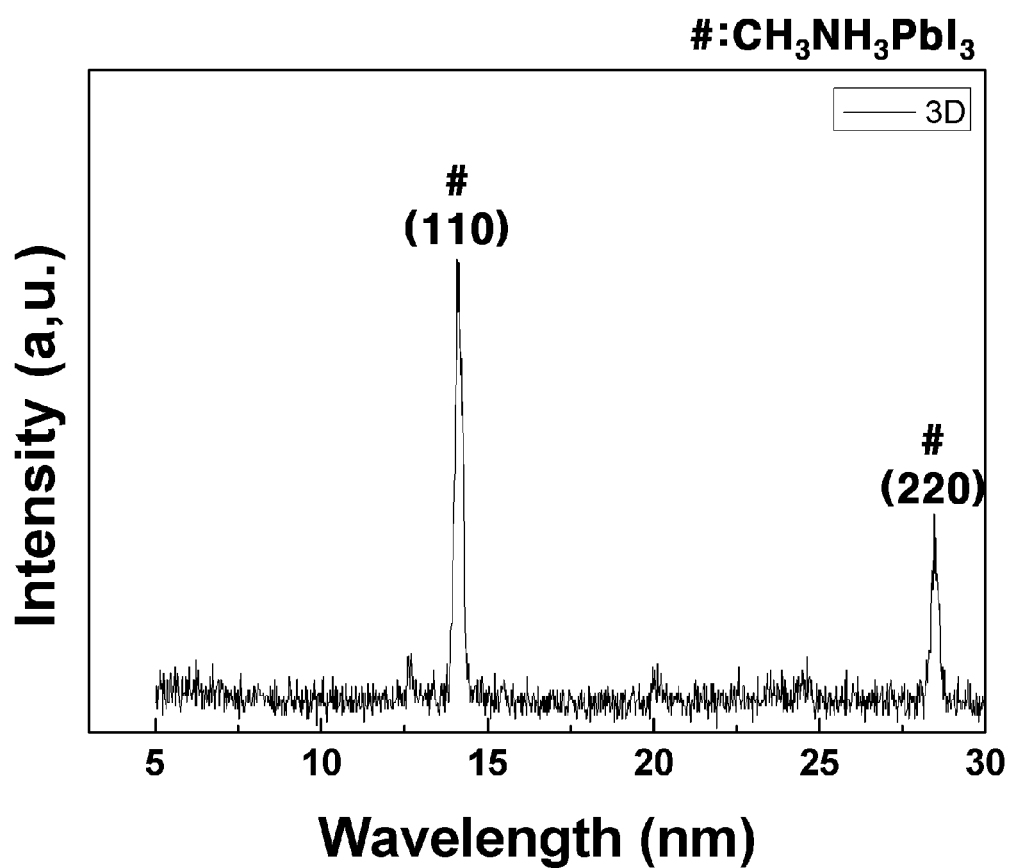
Figure 8A:
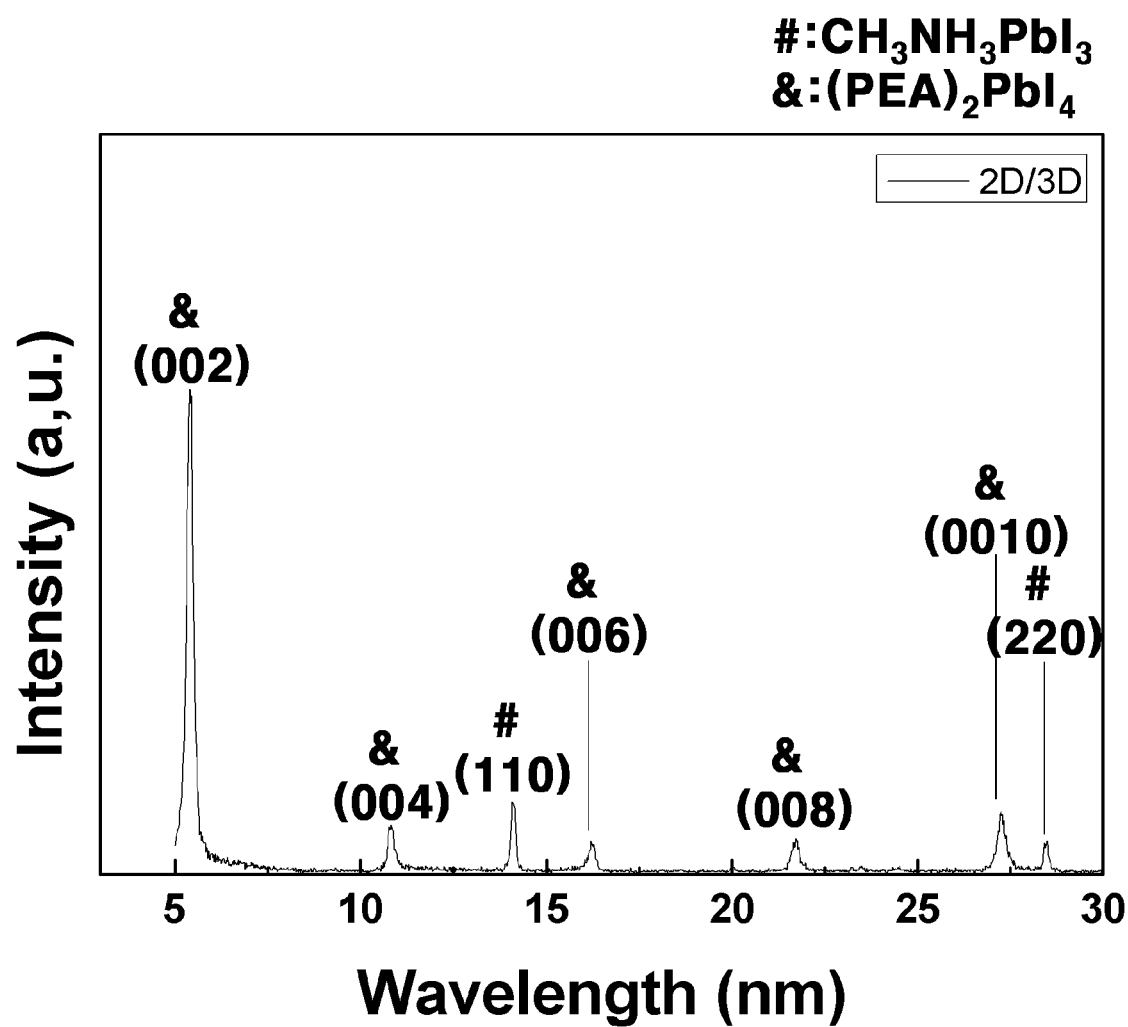
FIG. 8A and FIG. 8B are X-ray diffraction (XRD) graphs before and after a resistive random access memory device prepared according to an example of the present disclosure is exposed to moisture and light.
Figure 8B:
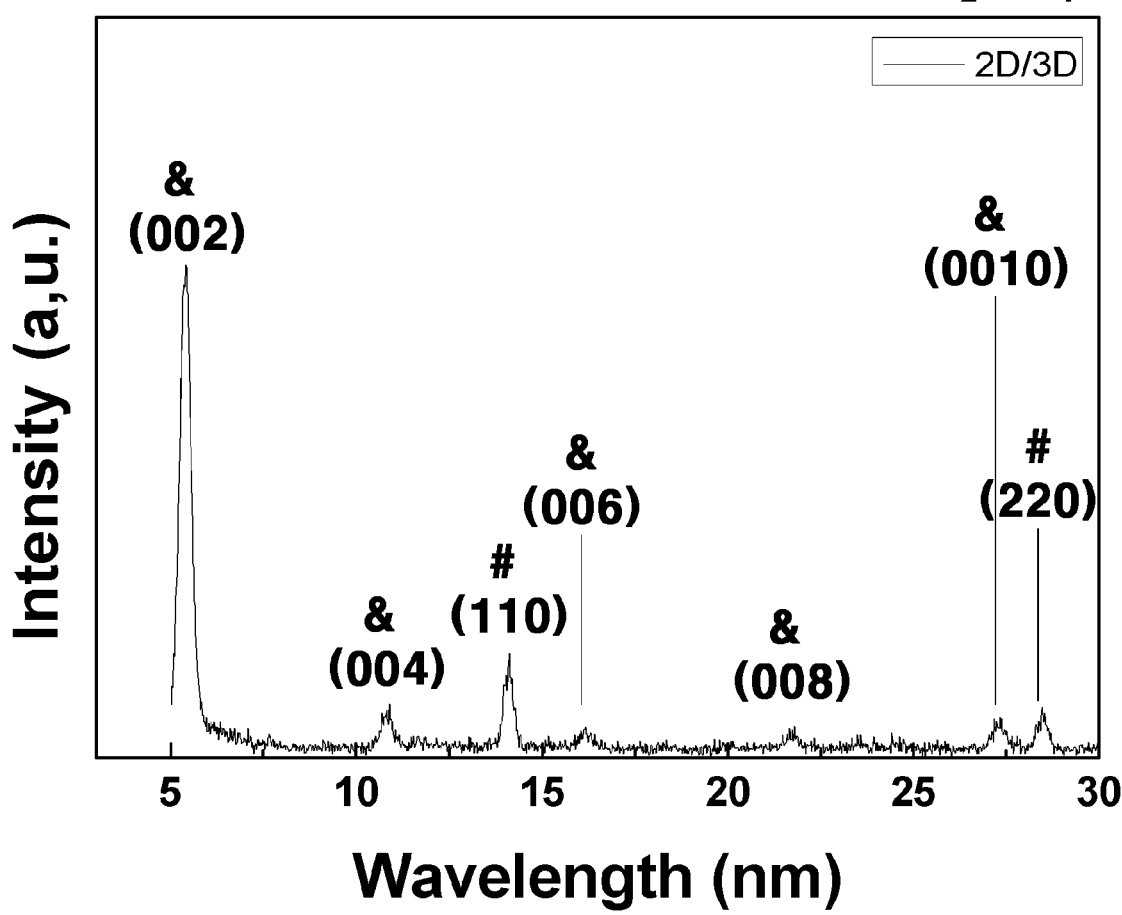

FIG. 7A and FIG. 7B are X-ray diffraction (XRD) graphs before (FIG. 7A) and after (FIG. 7B) a resistive random access memory device prepared according to Comparative Example of the present disclosure is exposed to moisture and light, and FIG. 8A and FIG. 8B are X-ray diffraction (XRD) graphs before (FIG. 8A) and after (FIG. 8B) a resistive random access memory device prepared according to Example of the present disclosure is exposed to moisture and light.

Referring to FIG. 7A, FIG. 7B, FIG. 7A and FIG. 7B, it was confirmed that the resistive random access memory device prepared according to Comparative Example showed the same X-ray diffraction pattern before and after being exposed to moisture and light (FIG. 7A and FIG. 7B) and contained only $CH_3NH_3PbI_3$ (indicated by # in FIG. 7A and FIG. 7B).

Meanwhile, it was confirmed that the resistive random access memory device prepared according to Example showed the same X-ray diffraction pattern before and after being exposed to moisture and light (FIG. 8A and FIG. 8B) like the resistive random access memory device prepared according to Comparative Example, but further contained $(PEA)_2PbI_4$ (indicated by & in FIG. 8A and FIG. 8B) in addition to $CH_3NH_3PbI_3$ (indicated by # in FIG. 8A and FIG. 8B).

Figure 9A:
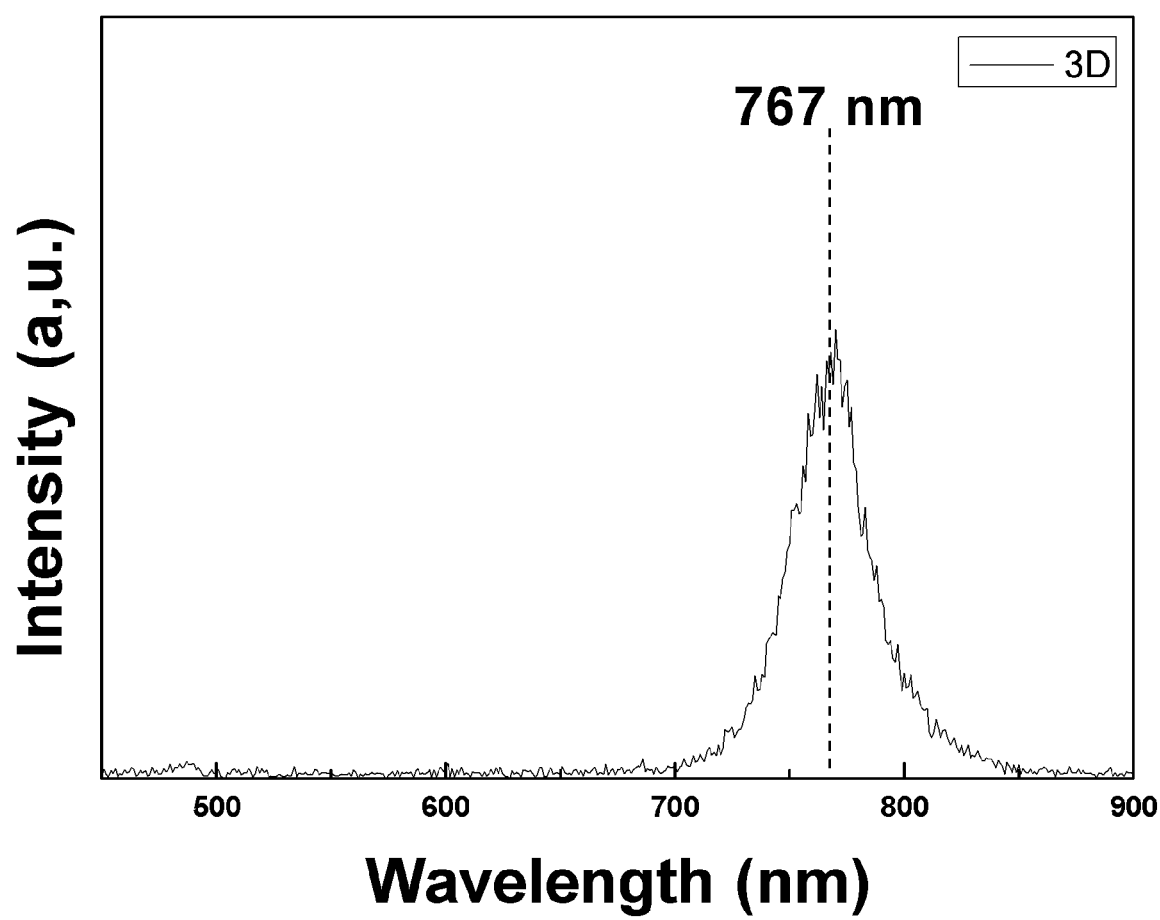
FIG. 9A and FIG. 9B are photoluminescence (PL) graphs before and after a resistive random access memory device prepared according to a comparative example of the present disclosure is exposed to moisture and light.
Figure 9B:
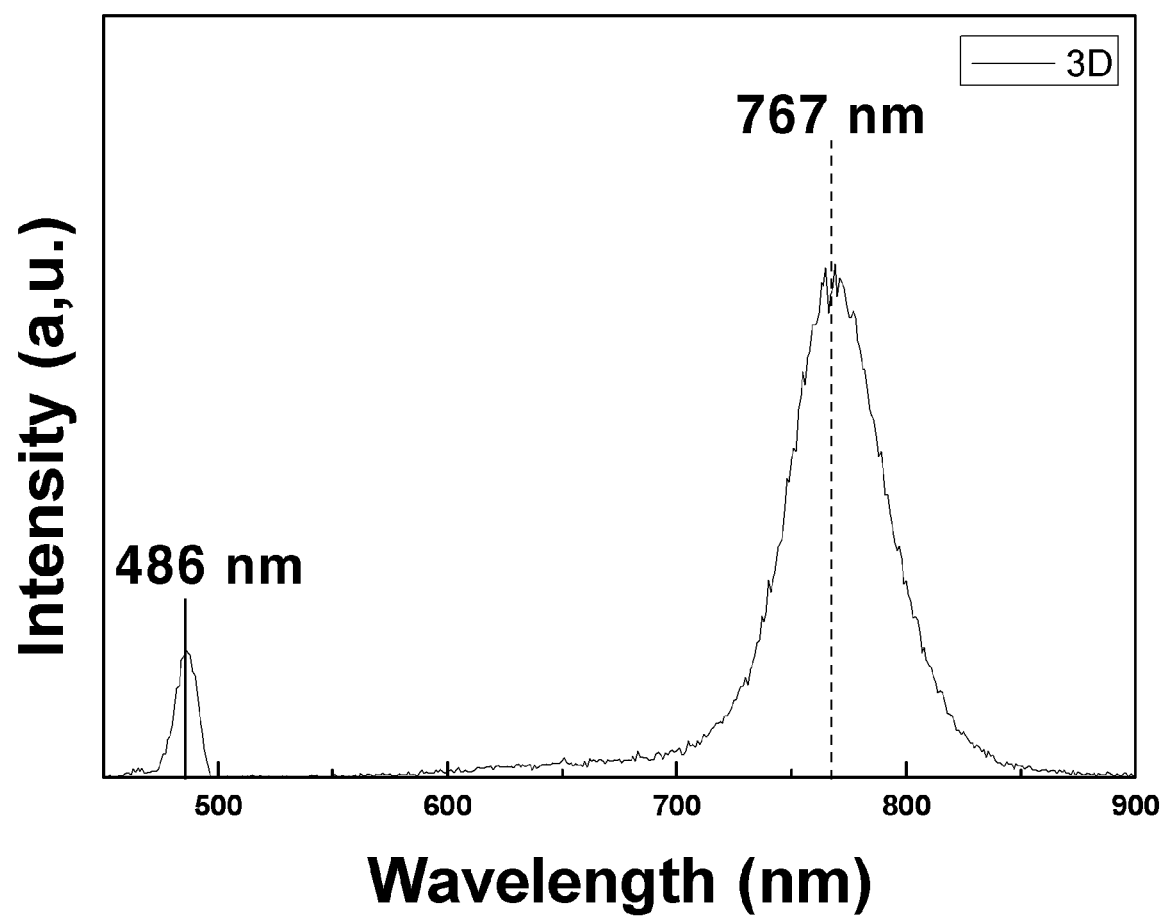
Figure 10A:
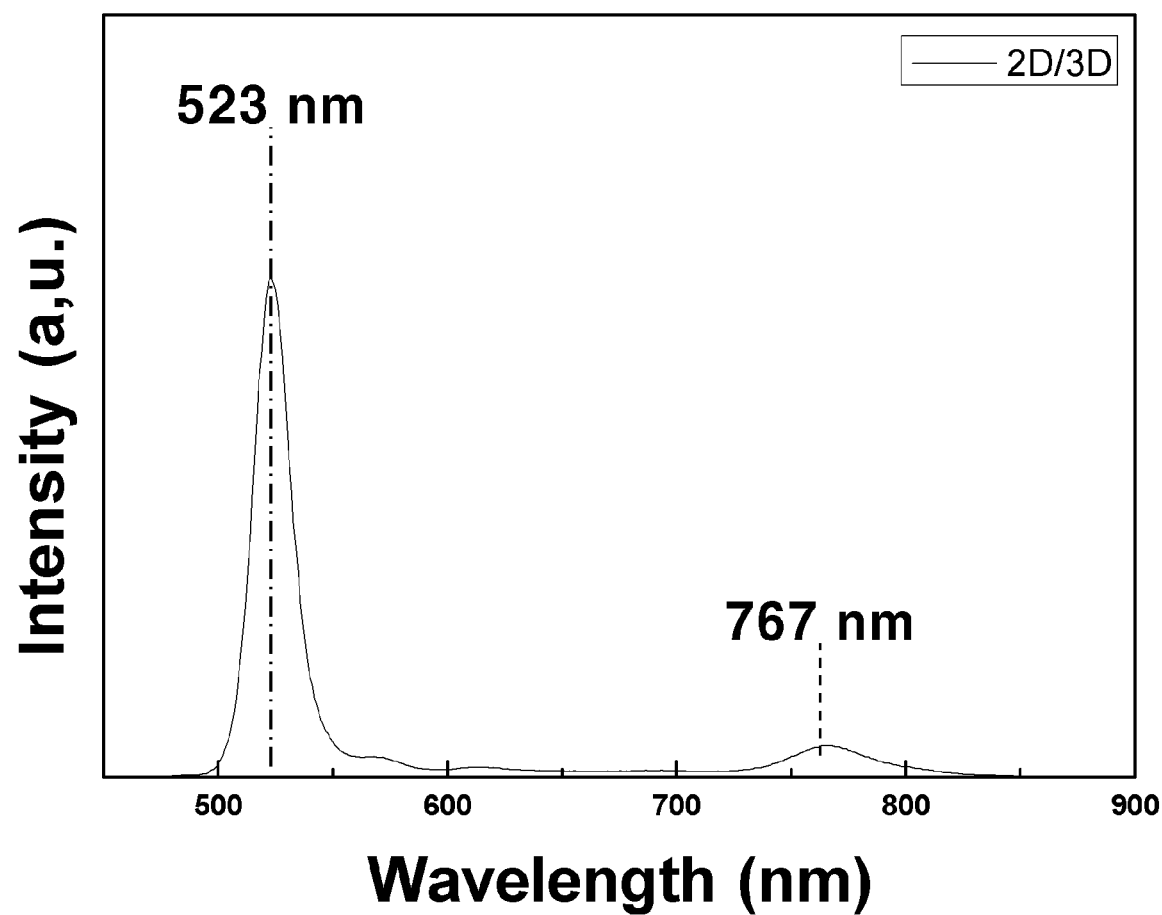
FIG. 10A and FIG. 10B are photoluminescence (PL) graphs before and after a resistive random access memory device prepared according to an example of the present disclosure is exposed to moisture and light.
Figure 10B:
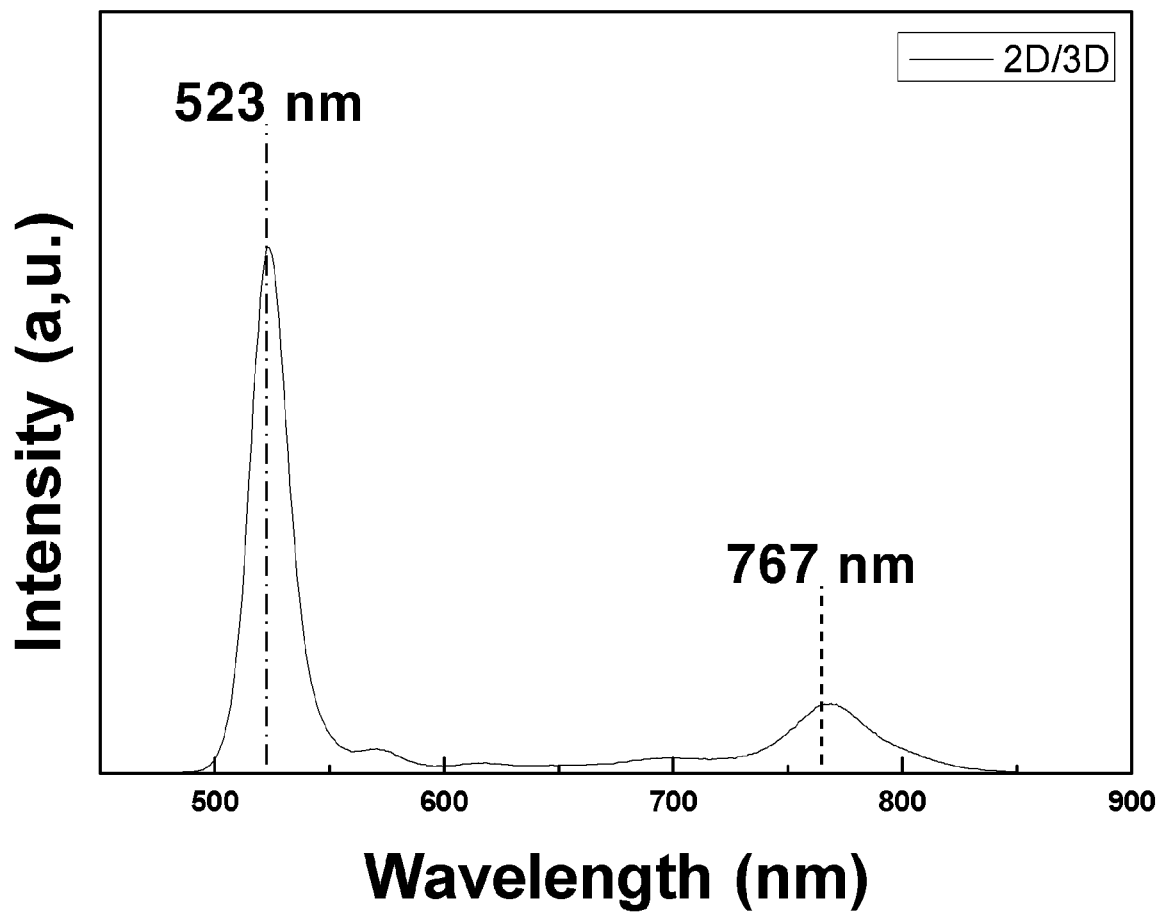

FIG. 9A and FIG. 9B are photoluminescence (PL) graphs before (FIG. 9A) and after (FIG. 9B) a resistive random access memory device prepared according to Comparative Example of the present disclosure is exposed to moisture and light, and FIG. 10A and FIG. 10B are photoluminescence (PL) graphs before (FIG. 10A) and after (FIG. 10B) a resistive random access memory device prepared according to Example of the present disclosure is exposed to moisture and light.

Referring to FIG. 9A, FIG. 9B, FIG. 10A and FIG. 10B, the resistive random access memory device according to Example showed the same graph before and after being exposed to moisture and light (FIG. 10A and FIG. 10B), but as for the resistive random access memory device according to Comparative Example, a new phase, which was not present in the graph before being exposed to moisture and light (FIG. 9A), was observed from the graph after being exposed to moisture and light (FIG. 9B).

Figure 11A:
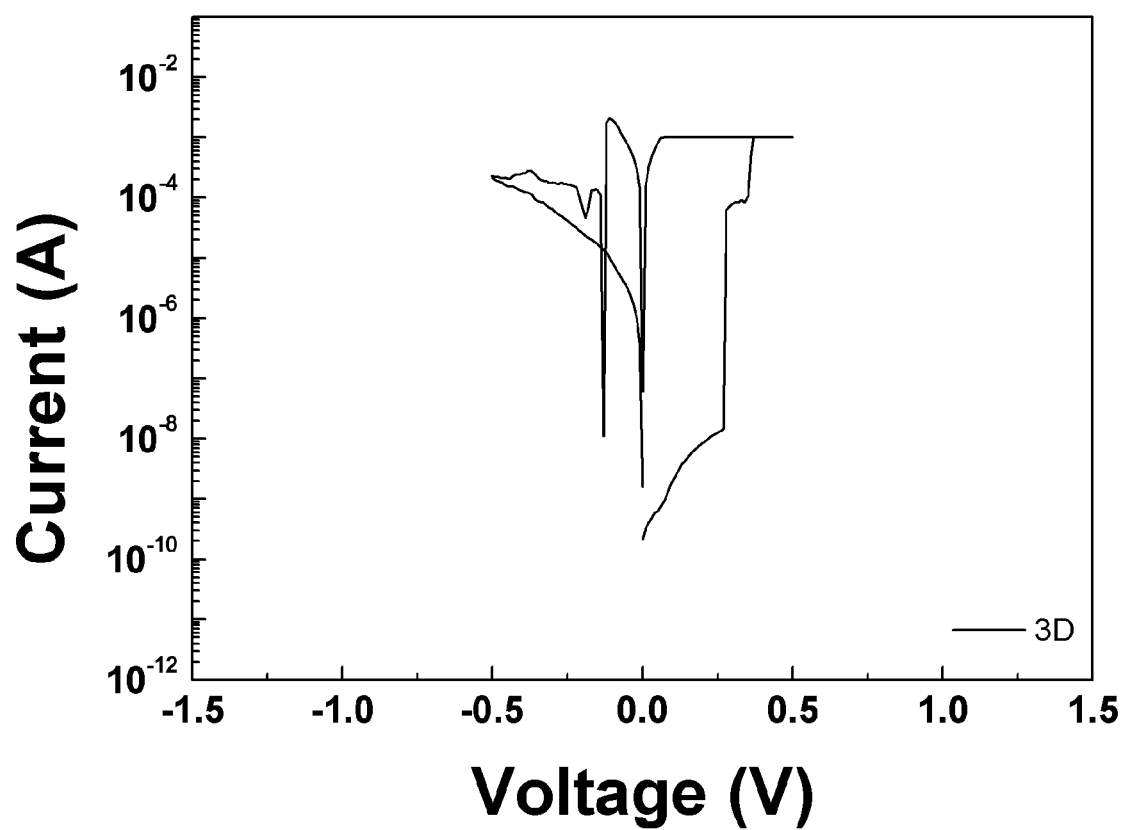
FIG. 11A and FIG. 11B are graphs showing the relationship between voltage and current measured before and after a resistive random access memory device prepared according to a comparative example of the present disclosure is exposed to moisture and light.
Figure 11B:
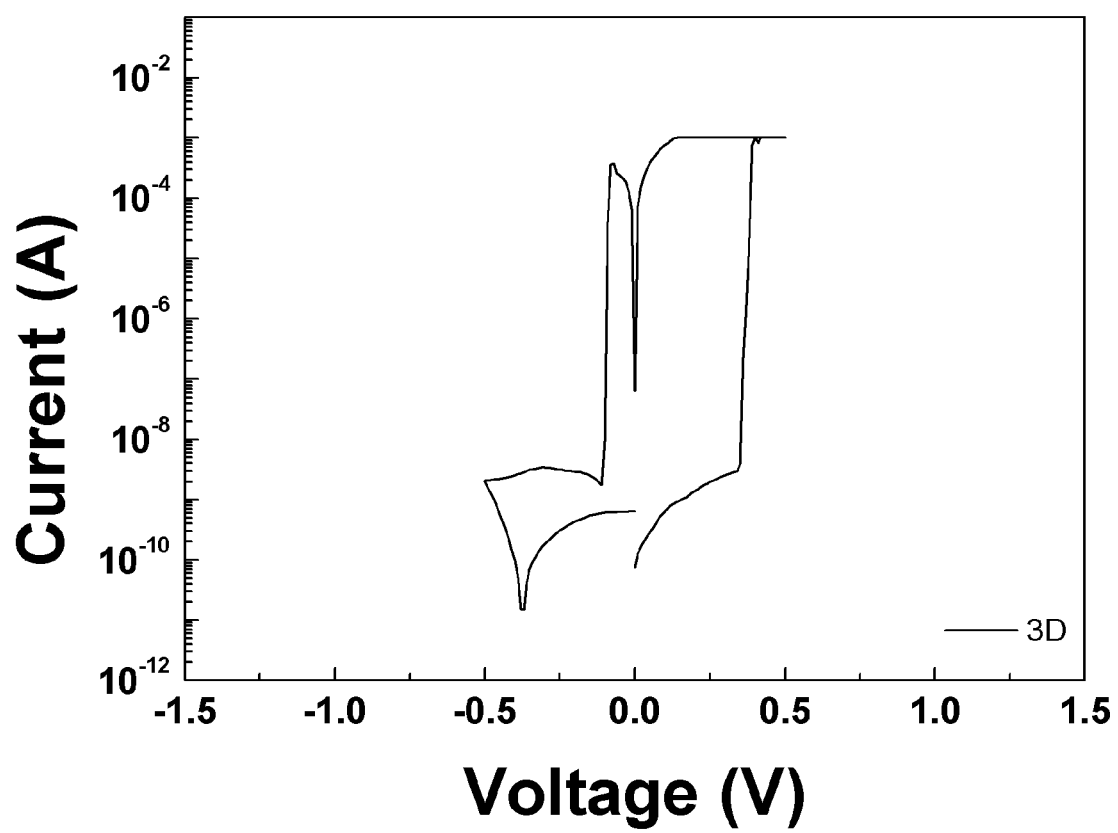
Figure 12A:
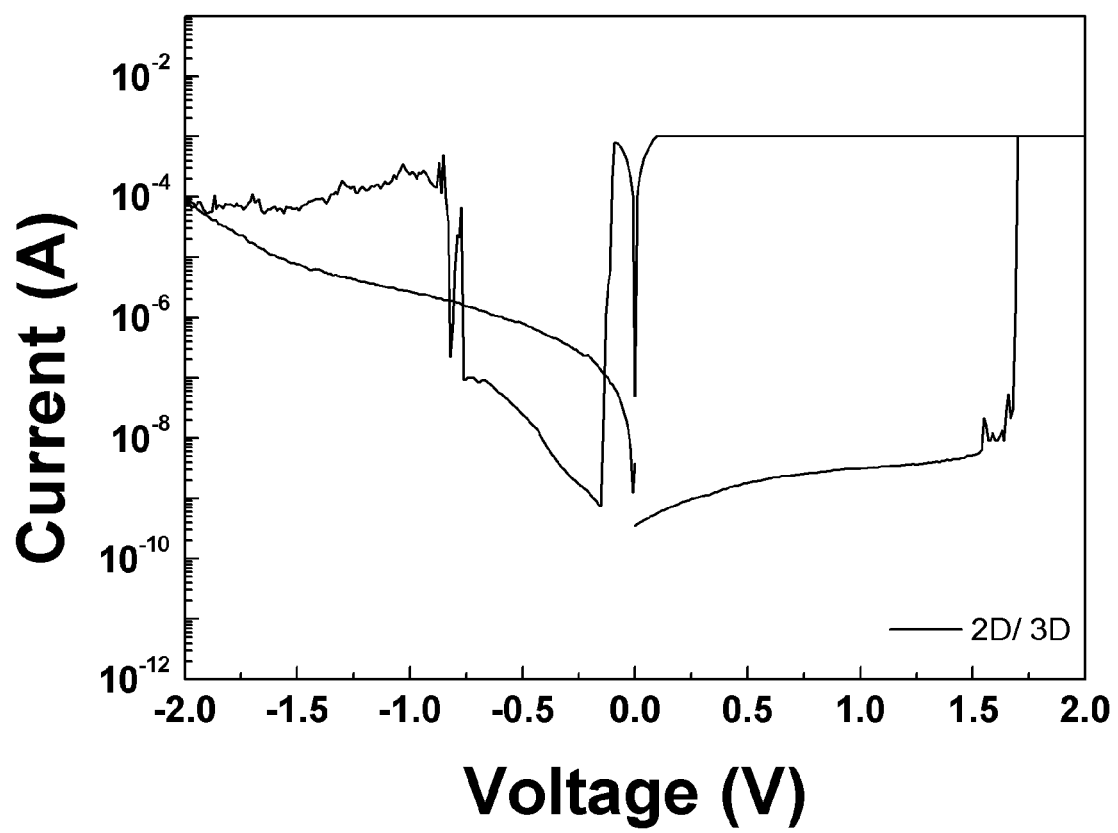
FIG. 12A and FIG. 12B are graphs showing the relationship between voltage and current measured before and after a resistive random access memory device prepared according to an example of the present disclosure is exposed to moisture and light.
Figure 12B:
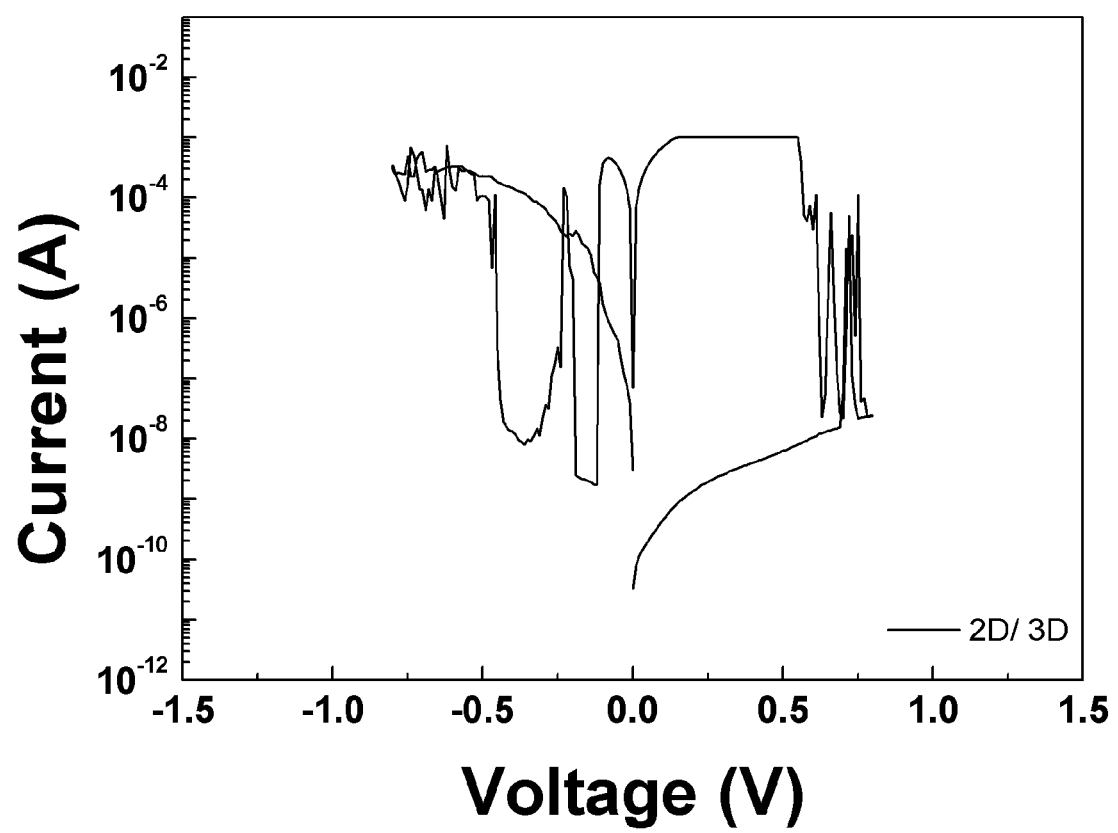

FIG. 11A and FIG. 11B are graphs showing the relationship between voltage and current measured before (FIG. 11A) and after (FIG. 11B) a resistive random access memory device prepared according to Comparative Example of the present disclosure is exposed to moisture and light, and FIG. 12A and FIG. 12B are graphs showing the relationship between voltage and current measured before (FIG. 12A) and after (FIG. 12B) a resistive random access memory device prepared according to Example of the present disclosure is exposed to moisture and light.

Referring to FIG. 11A, FIG. 11B, FIG. 12A and FIG. 12B, it was confirmed that the resistive random access memory device prepared according to Example (FIG. 12A and FIG.

12B) showed an increase in SET/RESET voltages as compared with the resistive random access memory device prepared according to Comparative Example (FIG. 11A and FIG. 11B). Further, the resistive random access memory device according to Example was still driven at low power with a very small change as compared with the resistive random access memory device according to Comparative Example.

Figure 13A:
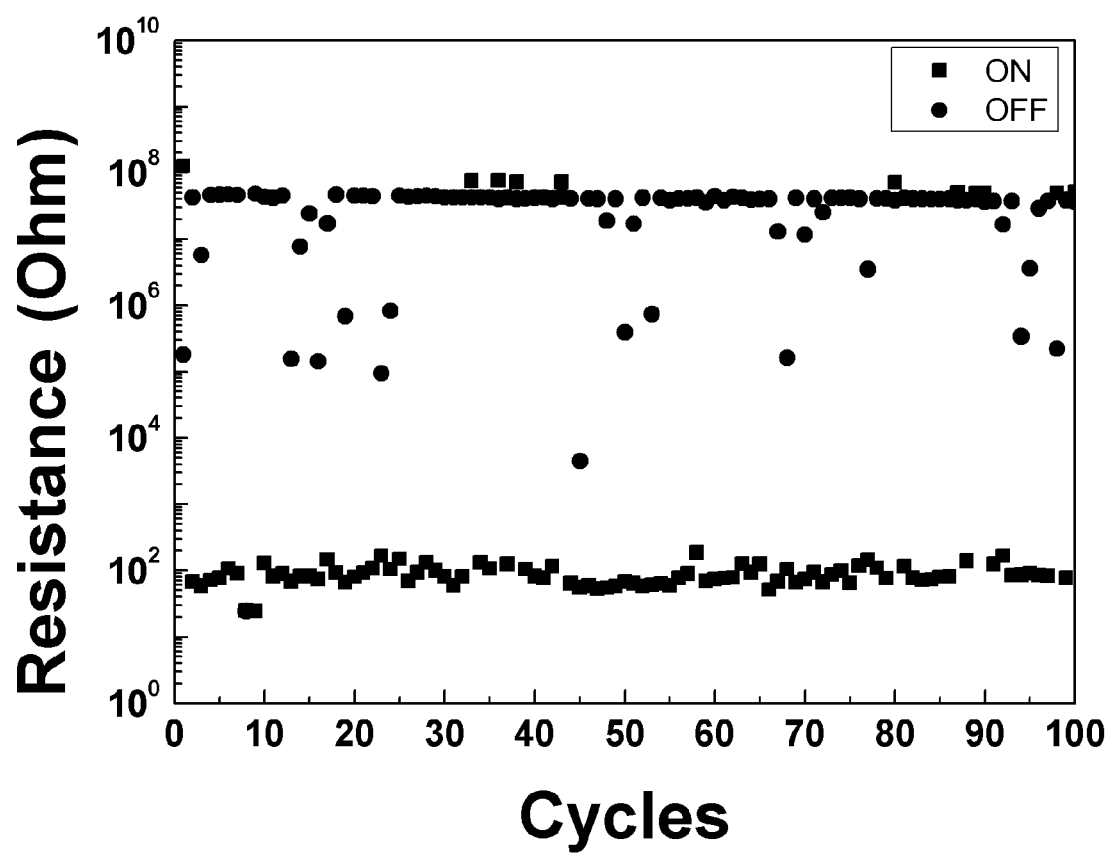
FIG. 13A and FIG. 13B are graphs showing the durability measured before and after a resistive random access memory device prepared according to a comparative example of the present disclosure is exposed to moisture and light.
Figure 13B:
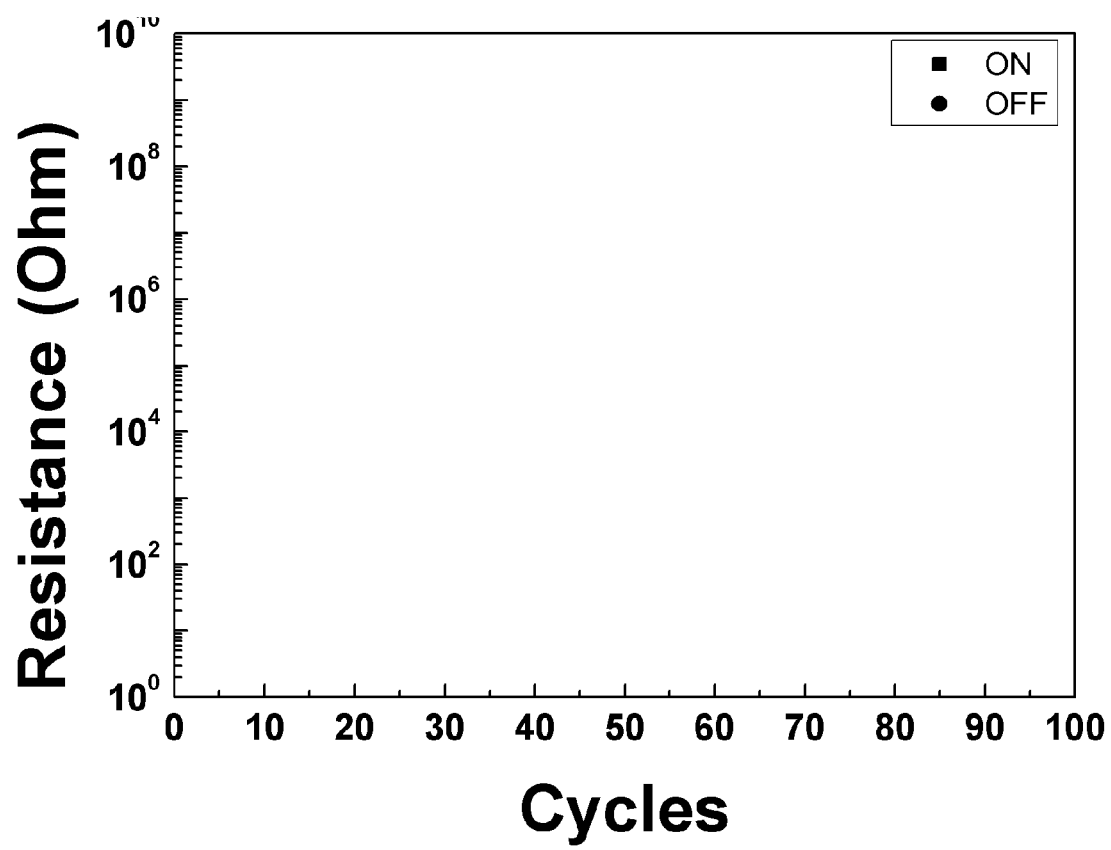
Figure 14A:
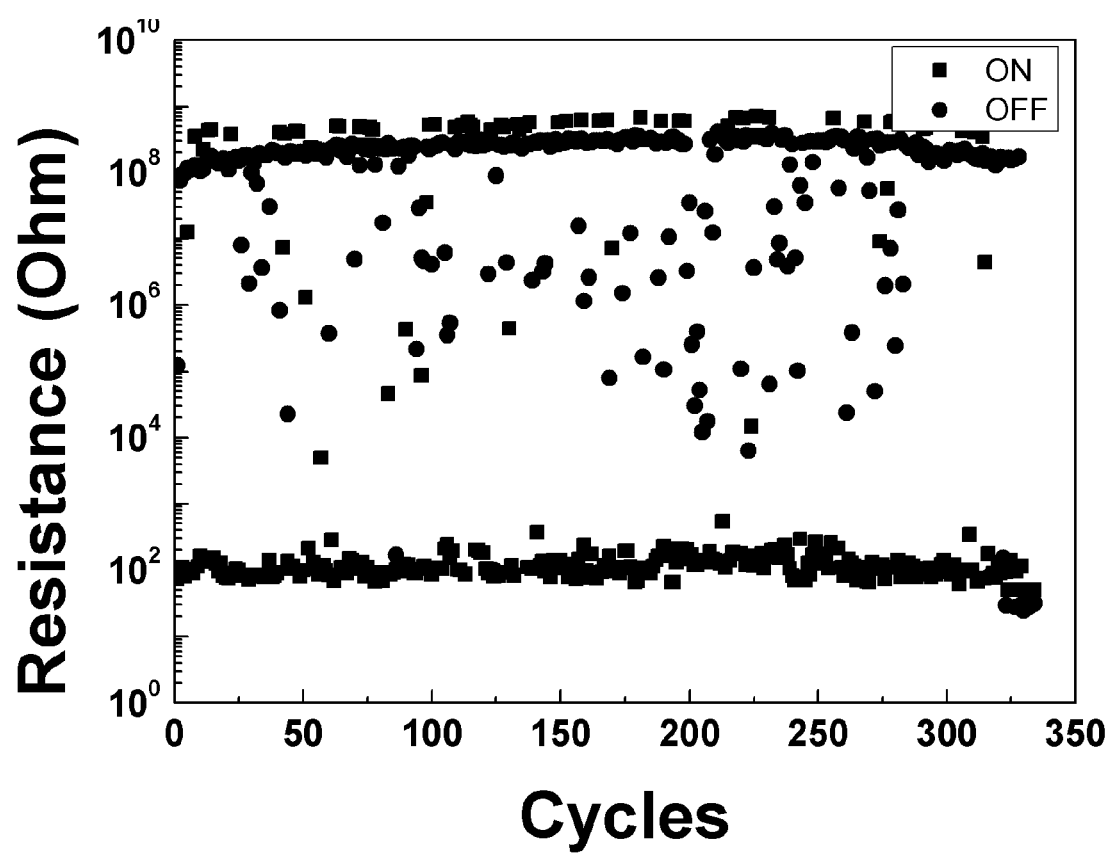
FIG. 14A and FIG. 14B are graphs showing the durability measured before and after a resistive random access memory device prepared according to an example of the present disclosure is exposed to moisture and light.
Figure 14B:
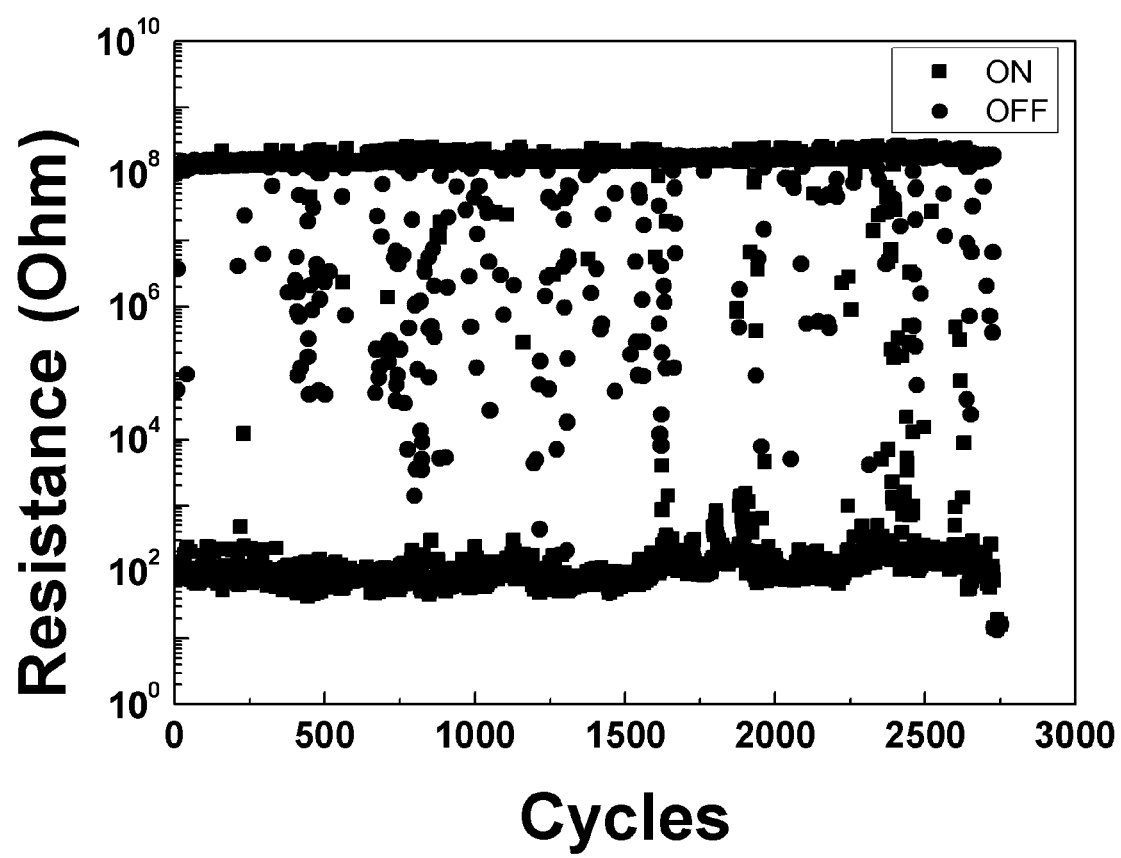

FIG. 13A and FIG. 13B are graphs showing the durability measured before (FIG. 13A) and after (FIG. 13B) a resistive random access memory device according to Comparative Example of the present disclosure is exposed to moisture and light, and FIG. 14A and FIG. 14B are graphs showing the durability measured before (FIG. 14A) and after (FIG. 14B) a resistive random access memory device according to Example of the present disclosure is exposed to moisture and light.

Referring to FIG. 13A, FIG. 13B, FIG. 14A and FIG. 14B, the resistive random access memory device according to Example was normally driven even after being exposed to moisture and light (FIG. 14B). However, the resistive random access memory device according to Comparative Example was not driven since it had reached the end of life after being exposed to moisture and light, and, thus, a blank graph was obtained (FIG. 13B).

Therefore, it was confirmed that the resistive random access memory device according to Example had excellent durability to moisture and light.

Further, referring to FIG. 14A and FIG. 14B, it was confirmed that the resistive random access memory device according to Example showed a higher reliability (durability) after being exposed to moisture and light than before. This was because the contact between the inside of the device and the interface improved.

The above description of the present disclosure is provided for the purpose of illustration, and it would be understood by a person with ordinary skill in the art that various changes and modifications may be made without changing technical conception and essential features of the present disclosure.

Thus, it is clear that the above-described embodiments are illustrative in all aspects and do not limit the present disclosure. For example, each component described to be of a single type can be implemented in a distributed manner. Likewise, components described to be distributed can be implemented in a combined manner. The scope of the present disclosure is defined by the following claims rather than by the detailed description of the embodiment. It shall be understood that all modifications and embodiments conceived from the meaning and scope of the claims and their equivalents are included in the scope of the present disclosure.

EXPLANATION OF REFERENCE NUMERALS

100: First electrode
200: First resistance change layer
210: Filament
300: Second resistance change layer
400: Polymer protective layer
500: Second electrode

We claim:
1. A resistive random access memory device, comprising:
a first resistance change layer formed on a first electrode and comprising an organic metal halide having a three-dimensional perovskite crystal structure;
a second resistance change layer formed on the first resistance change layer and comprising an organic metal halide having a two-dimensional perovskite crystal structure; and
a second electrode formed on the second resistance change layer.
2. The resistive random access memory device of claim 1, further comprising:
a polymer protective layer formed on the second resistance change layer.
3. The resistive random access memory device of claim 1, wherein the second resistance change layer includes perovskite particles having a bulk structure.
4. The resistive random access memory device of claim 1, wherein a filament size of the first resistance change layer is controlled by the second resistance change layer to improve durability of the resistive random access memory device.
5. The resistive random access memory device of claim 1, wherein a heterojunction structure of the three-dimensional perovskite crystal structure and the two-dimensional perovskite crystal structure provides stability to moisture and light.
6. The resistive random access memory device of claim 1, wherein the organic metal halide having the three-dimensional perovskite crystal structure is represented by the following Chemical Formula 1:

$$RMX_3 \qquad \text{[Chemical Formula 1]}$$

(R is a substituted or unsubstituted $C_{1-24}$ alkyl group, and when R is substituted, its substituent is an amino group, a hydroxyl group, a cyano group, a halogen group, a nitro group, or a methoxy group,
M includes a metal cation selected from the group consisting of Pb, Sn, Ge, Cu, Ni, Co, Fe, Mn, Cr, Pd, Cd, Yb, and combinations thereof, and
X includes a halide anion or a chalcogenide anion).
7. The resistive random access memory device of claim 1, wherein the organic metal halide having the two-dimensional perovskite crystal structure is represented by the following Chemical Formula 2:

$$R_2MX_4 \qquad \text{[Chemical Formula 2]}$$

(R is a substituted or unsubstituted $C_{1-24}$ alkyl group, and when R is substituted, its substituent is an amino group, a hydroxyl group, a cyano group, a halogen group, a nitro group, or a methoxy group,
M includes a metal cation selected from the group consisting of Pb, Sn, Ge, Cu, Ni, Co, Fe, Mn, Cr, Pd, Cd, Yb, and combinations thereof, and
X includes a halide anion or a chalcogenide anion).
8. The resistive random access memory device of claim 2, wherein the polymer protective layer includes an ionic conductive polymer selected from the group consisting of polymethyl methacrylate, polyethylene oxide, polypropylene oxide, polydimethylsiloxane, polyacrylonitrile, polyvinyl chloride, polyvinylidene fluoride, polyvinylidene fluoride-hexafluoropropylene, polyethyleneimine, polyphenylene terephthalamide, poly(methoxy polyethylene glycol methacrylate), poly (2-methoxy ethyl glycidyl ether), and combinations thereof.
9. The resistive random access memory device of claim 1, wherein the first electrode and the second electrode each independently include a material selected from the group consisting of a metal, a conductive polymer, a carbonaceous material, and combinations thereof.

10. A preparing method of a resistive random access memory device, comprising:
   forming a first electrode on a substrate;
   forming a first resistance change layer, on the first electrode, comprising an organic metal halide having a three-dimensional perovskite crystal structure;
   forming a second resistance change layer, on the first resistance change layer, comprising an organic metal halide having a two-dimensional perovskite crystal structure; and
   forming a second electrode on the second resistance change layer.

11. The preparing method of a resistive random access memory device of claim 10,
   wherein the forming of the first resistance change layer is performed by coating, on the first electrode, a solution in which the organic metal halide having the three-dimensional perovskite crystal structure is dissolved in a first solvent.

12. The preparing method of a resistive random access memory device of claim 11,
   wherein the first solvent is selected from the group consisting of dimethylformamide, dimethylsulfoxide, dimethylacetamide, N-methylpyrrolidone, N-methyl-2-pyridine, pyridine, aniline, and combinations thereof.

13. The preparing method of a resistive random access memory device of claim 10,
   wherein the second resistance change layer is formed to have the two-dimensional perovskite crystal structure by coating, on the first resistance change layer, a solution in which an organic halide is dissolved in a second solvent and partially melting some of the three-dimensional perovskite crystals with the second solvent.

14. The preparing method of a resistive random access memory device of claim 13,
   wherein the second solvent is a protic solvent including branched alcohols having 3 to 6 carbon atoms.

15. The preparing method of a resistive random access memory device of claim 10, further comprising:
   forming a polymer protective layer on the second resistance change layer.

16. The preparing method of a resistive random access memory device of claim 10,
   wherein the organic metal halide having the three-dimensional perovskite crystal structure is represented by the following Chemical Formula 3:

$$RMX_3 \quad \text{[Chemical Formula 3]}$$

(R is a substituted or unsubstituted $C_{1-24}$ alkyl group, and when R is substituted, its substituent is an amino group, a hydroxyl group, a cyano group, a halogen group, a nitro group, or a methoxy group,
   M includes a metal cation selected from the group consisting of Pb, Sn, Ge, Cu, Ni, Co, Fe, Mn, Cr, Pd, Cd, Yb, and combinations thereof, and
   X includes a halide anion or a chalcogenide anion).

17. The preparing method of a resistive random access memory device of claim 10,
   wherein the organic metal halide having the two-dimensional perovskite crystal structure is represented by the following Chemical Formula 4:

$$R_2MX_4 \quad \text{[Chemical Formula 4]}$$

(R is a substituted or unsubstituted $C_{1-24}$ alkyl group, and when R is substituted, its substituent is an amino group, a hydroxyl group, a cyano group, a halogen group, a nitro group, or a methoxy group,
   M includes a metal cation selected from the group consisting of Pb, Sn, Ge, Cu, Ni, Co, Fe, Mn, Cr, Pd, Cd, Yb, and combinations thereof, and
   X includes a halide anion or a chalcogenide anion).

* * * * *